(12) United States Patent
Iriki

(10) Patent No.: US 6,716,648 B2
(45) Date of Patent: Apr. 6, 2004

(54) METHOD OF MANUFACTURING AND TESTING SEMICONDUCTOR INTEGRATED CIRCUIT DEVICE

(75) Inventor: Nobuyuki Iriki, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 165 days.

(21) Appl. No.: 10/025,458

(22) Filed: Dec. 26, 2001

(65) Prior Publication Data

US 2002/0081758 A1 Jun. 27, 2002

(30) Foreign Application Priority Data

Dec. 26, 2000 (JP) ........................................ 2000-394885

(51) Int. Cl.[7] .............................................. H01L 21/66
(52) U.S. Cl. ........................... 438/14; 438/689; 438/780
(58) Field of Search ............................. 438/14, 16, 17, 438/689, 780, 784

(56) References Cited

U.S. PATENT DOCUMENTS 6,349,240 B2 * 2/2002 Ogawa et al. ............... 700/121
6,472,239 B2 * 10/2002 Hembree et al. ............. 438/18

FOREIGN PATENT DOCUMENTS

| JP | 10050788 | 2/1998 |
|---|---|---|
| JP | 10154664 | 6/1998 |
| JP | 11109654 | 4/1999 |

* cited by examiner

*Primary Examiner*—Van Thu Nguyen
*Assistant Examiner*—Brad Smith
(74) *Attorney, Agent, or Firm*—Antonelli, Terry, Stout & Kraus, LLP

(57) ABSTRACT

The efficiency is improved for a lithography step in a process of manufacturing semiconductor integrated circuits. For each semiconductor wafer, the method has a step of depositing a photosensitive organic film, a step of performing exposure processing, a step of performing development processing, a step of conducting a test, and a consistent processing step for removing the photosensitive organic film of a semiconductor wafer determined as nonstandard in the test in the processing unit for depositing the photosensitive organic film, and returning again to the step of depositing the photosensitive organic film to regenerate the semiconductor wafer. During the regeneration processing for the semiconductor wafer, other processing is automatically performed in parallel for other semiconductor wafers of the plurality of semiconductor wafers in a system for performing the consistent processing.

40 Claims, 24 Drawing Sheets

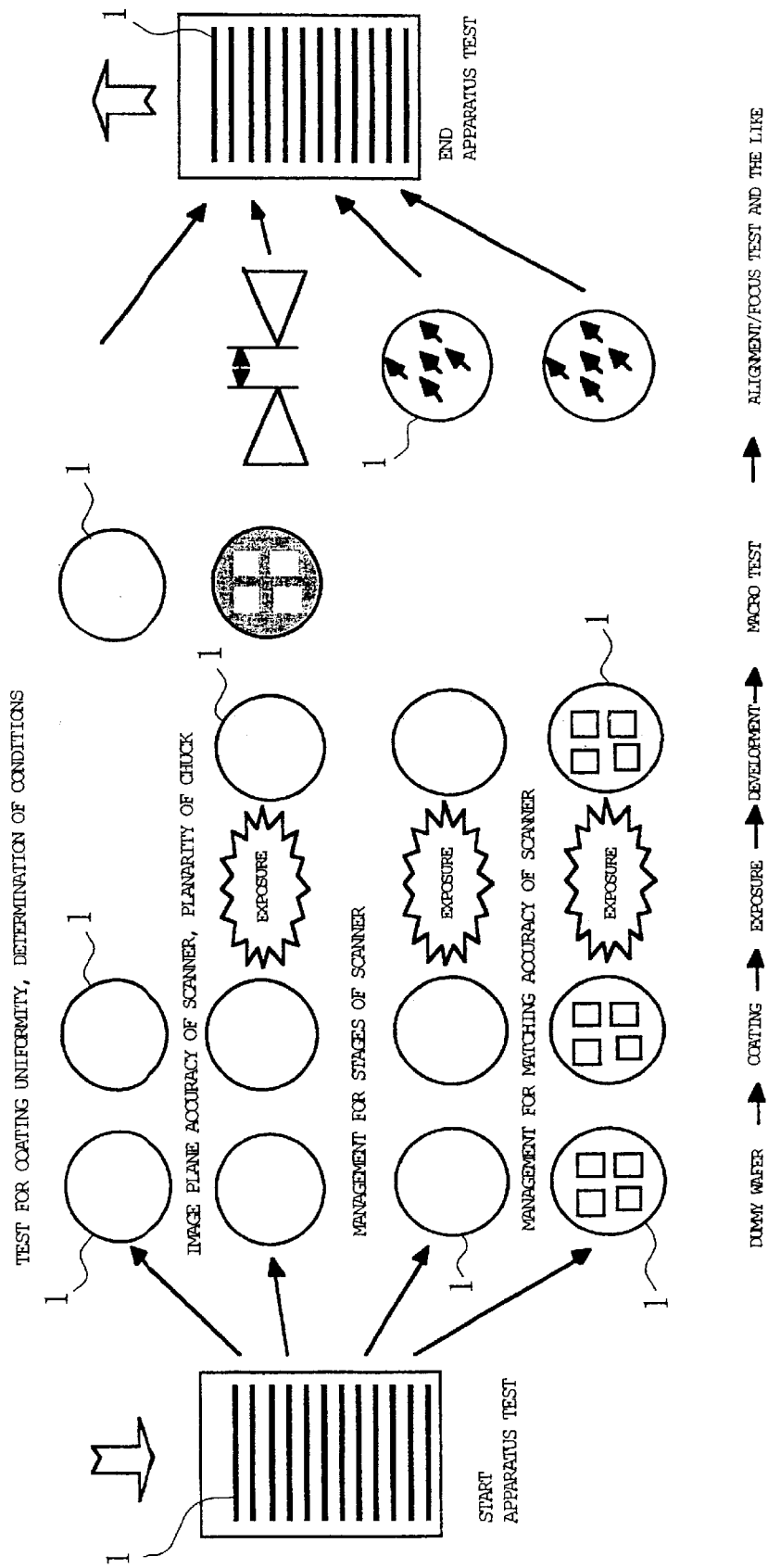

METHOD OF MANUFACTURING AND TESTING SEMICONDUCTOR INTEGRATED CIRCUIT DEVICE

BACKGROUND OF THE INVENTION

The present invention relates to a technique for manufacturing semiconductor integrated circuit devices, and more particularly to a technique effectively applied to the photolithography (hereinafter simply called a lithography) technique in the process of manufacturing semiconductor integrated circuit devices.

In the manufacturing of semiconductor integrated circuit devices (LSI: Large Scale Integrated circuit), the lithography technology has been used for forming micro-patterns on a semiconductor wafer (hereinafter simply called a wafer).

Techniques related to the lithography technology are described, for example, in Japanese Patent Laid-open No. 10-50788. This discloses a system that couples both an electronic system which has information available for determining regeneration, and a lithography processing apparatus by communications, and that automatically determines whether it is a failure or a pass on the basis of results of a tester, and that executes regenerative processing without delay. Importance underlying this system is that communication and information are connected to each other. In the electronic system, the electronic system may be separated from the lithography processing apparatus, or the electronic system information irrespective of whether respective apparatuses are separated, consistent or integrated. It is however assumed that the apparatuses should be integrated for convenience.

Besides, for example, there are also technologies disclosed in Japanese Patent Laid-open No. 11-109654 and No. 10-154664.

SUMMARY OF THE INVENTION

In a lithography step in the process of manufacturing semiconductor integrated circuit devices, however, there is a challenge for addressing how semiconductor integrated circuit devices should be efficiently manufactured in a short time and in high quality.

For example, in a plan of a line for processing a large-diameter wafer of approximately 300 mm, the present inventors considered a strategy of allocating a fixed processing time for each step and eliminating a stock between steps in the production on a very QTAT (Quick Turn Around Time) basis. For implementing this strategy, a work time must be consistent per lot on a line in a lithography step. The lithography, however, involves a predecessor work, development testing, regeneration work and the like, unlike other steps, thereby causing an unstable work time which could result in pulsatile material flows and increased TAT. It should be noted that the predecessor work refers to acquisition of a variety of information on the manufacturing by introducing a wafer for testing on a manufacturing line prior to the manufacturing of wafers for products.

The predecessor work, development testing and regeneration work can involve division and/or aggregation of lots, which however is quite difficult to accommodate with a strategy of relying on an automatic schedule control system to manage cassettes for closed containers which support a mini-environment that is a standard for a manufacturing line for the large-diameter wafers.

In the development testing and regeneration, lots are intensively supplied from a large number of aligners to a small number of apparatuses dedicated to the associated processing, causing an overload on conveyers and wasteful TAT losses due to conveyance, shifting, other handling, waiting therefor, and the like.

Further, since the aligner which supports a large-diameter wafer is very expensive, it is essential to increase the operating rate and throughput, however, the aforementioned predecessor work and regeneration processing largely reduce the operating rate of the aligner. On the other hand, since the large-diameter wafer provides the amount of produced chips per wafer increased by a factor of 2.25, a flexible production scheme and an ensured quality are essential. The flexible production causes a lower operating rate due to an increased predecessor frequency, as well as a significant reduction in the amount of data available for quality control due to a decreased amount of testing data on the same types of products, or difficulties in ensuring the quality due to an increased error depending on the type This results in an increased tendency to rely on the predecessor, development testing and regeneration. It is difficult to satisfy both conflicting requirements while increasingly severe accuracies are demanded for products.

While the lithography system disclosed in the aforementioned patent document could accomplish an adequately increased efficiency, if implemented, the present inventors have found that the disclosed system implies the following problems.

First, the lithography system determines pass/fail for wafers based on a test on a set number of extracted wafers, and proceeds to the regeneration if wafers are determined to fall out of criteria, where all wafers in a lot are subjected to the regeneration. In this case, when the regeneration frequency is increased due to strict conditions on the quality requirements or in a flexible production, the operating rate of associated apparatuses becomes lower, with a resulting increase in TAT.

Also, the consistency refers to the arrangement in a single direction conforming to a processing flow (processing, testing and regeneration), without consideration of the association with other processing such as those after the regeneration, predecessor, and the like, so that it cannot be said that the resulting effects and applicable range are sufficient. In addition, the removal of the resist is considered on the assumption that the resist is removed by an asher in a vacuum chamber. Therefore, a wafer cannot be looped back to repetitive processing immediately after a resist has been removed from the wafer, and continuation to post-processing cannot yet be realized.

Further, since the foregoing system is based on the concept of lot testing, it fails to integrate functions required for automation, such as a testing step prior to regeneration, investigation of causes for regeneration, and the like.

In view of the above problems inherent to the prior art, an object of the present invention is to provide a technology which is capable of improving the efficiency of a lithography step in a process of manufacturing semiconductor integrated circuit devices.

An object of the present invention is to provide a technology which is capable of reducing a period for a lithography step in a process of manufacturing semiconductor integrated circuit devices.

An object of the present invention is to provide a technique which is capable of improving the quality of semiconductor integrated circuit devices.

The above and other objects and novel features of the present invention will become apparent from the description of the specification and the accompanying drawings.

The following outlines a concept of a representative aspect of the invention disclosed in the present application.

According to one aspect of the present invention, there is provided a semiconductor integrated circuit devices for each semiconductor wafer comprising a step of depositing a photosensitive organic film, a step of performing exposure processing, a step of performing development processing, a step of conducting a test, and a consistent processing step for removing the photosensitive organic film of a semiconductor determined as nonstandard in the test, and returning again to the step of depositing the photosensitive organic film to regenerate the semiconductor wafer, wherein during the regeneration processing for the semiconductor wafer, other processing is automatically performed in parallel for other semiconductor wafers of the plurality of semiconductor wafers in a system for performing the consistent processing.

According to another aspect of the present invention, there is provided the semiconductor integrated circuit devices, wherein the semiconductor wafer to be regenerated is processed during the processing after the regeneration, using the amount of correction used when the semiconductor wafer was processed and the amount of correction calculated from the result instead of the amount of correction used when other semiconductor wafers are processed.

According to still another aspect of the present invention, there is provided the semiconductor integrated circuit devices, wherein the step of specifying a waiting semiconductor wafer due to determination of a semiconductor wafer which should be regenerated, and waiting the semiconductor wafer is controlled to be able to specify a plurality of waiting semiconductor wafers.

According to still another aspect of the present invention, there is provided the semiconductor integrated circuit devices, wherein the tester has a cassette loader, and processes both of a semiconductor wafer supplied from a coater/developer connected in an in-line configuration, and a semiconductor wafer supplied from the cassette loader.

According to still another aspect of the present invention, there is provided the semiconductor integrated circuit devices, wherein the cassette loader of the tester is installed in the same direction or on the same plane as the cassette loader of the coater/developer, and has an interface with conveying means common to the cassette loader of the coater/developer.

According to still another aspect of the present invention, there is provided the semiconductor integrated circuit devices, wherein a plurality of testers are connected through a conveyer for conveying supplied semiconductor wafers within a system for performing the consistent processing to sequentially process these test in a pipeline operation.

According to still another aspect of the present invention, there is provided the semiconductor integrated circuit devices, wherein when a nonstandard failure is detected when the plurality of tests are sequentially processed in a pipeline operation, the test is detailed, and a subsequent test is conducted based on the previous test.

BRIEF DESCRIPTION OF THE DRAWINGS

FIG. 17 is an explanatory diagram of the processing involved in accommodating a plurality of semiconductor wafers in a single cassette for a total testing in a method of manufacturing semiconductor integrated circuit devices according to another embodiment of the present invention.

DETAILED DESCRIPTION OF THE PREFERRED EMBODIMENTS

Figure 1:
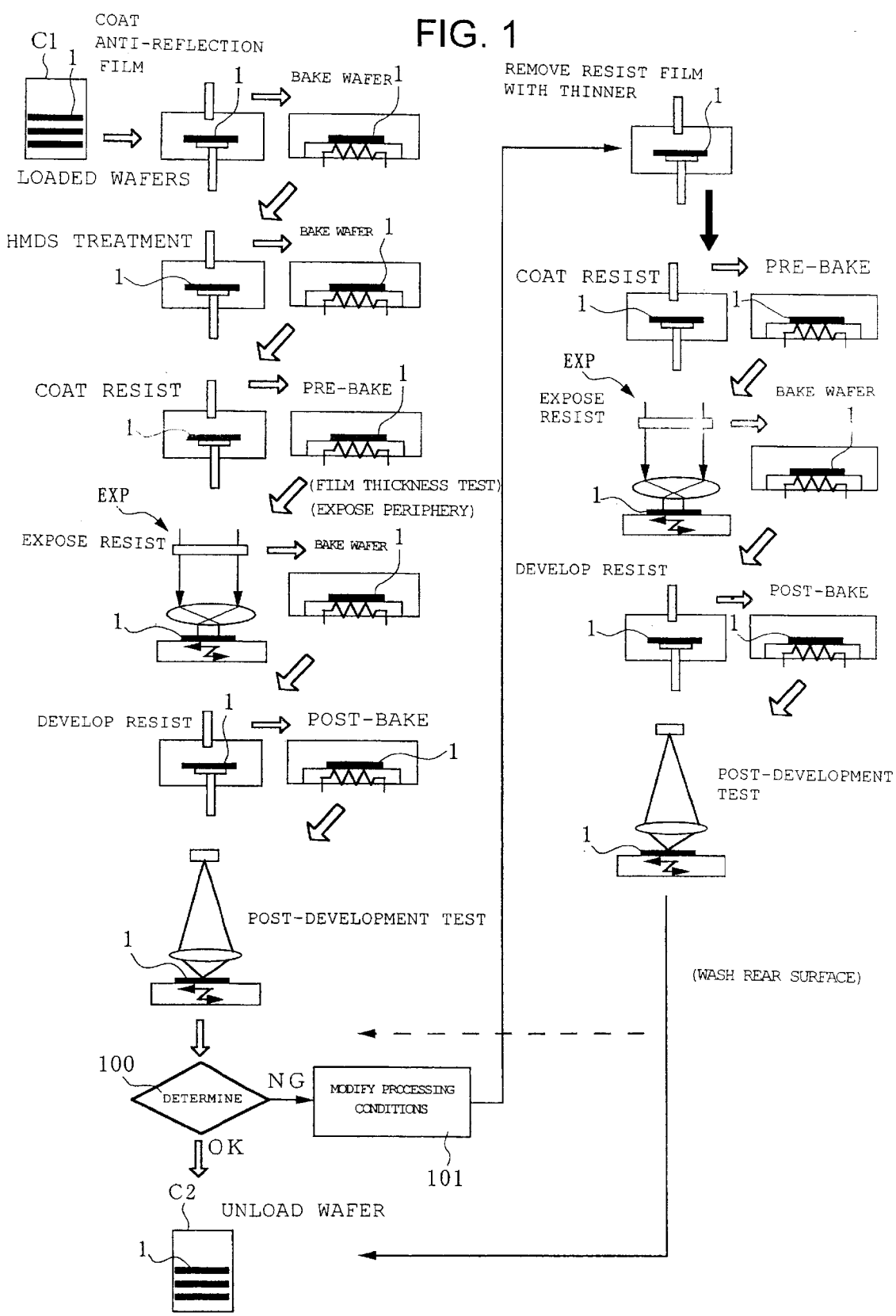
FIG. 1 is an explanatory diagram of a flow through which a semiconductor wafer is processed in a process of manufacturing semiconductor integrated circuit devices in accordance with one embodiment of the present invention.

Prior to describing the present invention in detail, terms used in this disclosure will be described below.

1. A wafer refers to a silicon single-crystal substrate (generally having a substantially flat disk shape), a sapphire substrate, a glass substrate, other insulating, non-insulating or semiconductor substrate, and a composite substrate formed of any combination of the foregoing. Also, it is assumed that a semiconductor integrated circuit device referred to in this disclosure includes that fabricated on a semiconductor or insulating substrate such as a silicon wafer, a sapphire substrate or the like but that fabricated on an insulating substrate such as glass or the like as TFT (Thin-Film-Transistor) and STN (Super-Twisted-Nematic) liquid crystal, and the like, unless otherwise explicitly noted.

2. A device surface refers to a main surface of a wafer on which device patterns are formed corresponding to a plurality of chip areas by lithography.

3. Scanning Exposure: an exposure method for transferring a circuit pattern on a mask onto a desired region on a wafer by relatively scanning a narrow slit-like exposure band in a direction orthogonal to the longitudinal direction of the slit with respect to the wafer and mask (the scanning maybe in an oblique direction). An apparatus for implementing this exposure method is called a scanner.

4. Step and Scan Exposure: a method of exposing the entirety of portions on a wafer to be exposed in a combination of the scanning exposure and stepping exposure. This falls under a lower concept of the scanning exposure.

5. Step And Repeat Exposure: an exposure method of repeatedly stepping a wafer to a projected image of a circuit pattern on a mask to transfer the circuit pattern on the mask onto desired regions on the wafer. An apparatus for implementing this exposure method is called a stepper.

6. Chemical Mechanical Polishing (CMP) refers to polishing a surface under polishing by relatively moving the same inplane directions while supplying a slurry with the surface being in contact with a polishing pad generally comprised of a relatively soft cloth-like sheet material. In this application, it is assumed that CMP additionally includes CML (Chemical Mechanical Lapping) for lapping a surface under lapping by relatively moving the same on a hard grindstone surface, a method using other fixed abrasive grains, grain-free CMP which does not use abrasive grains, and the like.

7. Predecessor: The processing for acquiring information on a variety of processing by introducing a wafer for acquiring information on a line prior to supplying wafers for products. In this case, an introduced wafer is called a predecessor wafer. Information acquired by the predecessor wafer is used as information for supplying wafers for products to correct a variety of processing conditions.

8. Leaf Processing refers to a method of processing wafers one by one when the wafers are applied with a variety of processing. Since processing conditions can be controlled for each wafer, the leaf processing excels in the accuracy and reproductivity of the processing, and is also advantageous in reduction of the processing apparatus itself in size.

9. In-Line Method, In-line: a series of apparatuses (processing) which interconnect a plurality of processes for automatically conveying wafers from one step to another to permit consistent processing in wafer processing facilities.

10. Pipeline Operation: an operation for parallelly processing flow processes for a plurality of wafers. An in-line pipeline operation refers to a processing operation for wafers in a line in which respective processes are connected in hardware and in software to enable the pipeline operation.

11. Consistent Apparatus (consistent Processing): an apparatus (processing) which includes a regeneration loop to enable an in-line pipeline operation. In the consistent apparatus, the processing order is definite, while regeneration processing or the like on a wafer is parallelly performed with other processing on the remaining wafers which is automatically advanced simultaneously.

12. QC Integration: a system which integrally incorporates testing processing for quality management in a consistent apparatus in hardware and in software for automatic parallel execution of the testing processing.

It should be noted that in the following description of the present invention, the description may be divided into a plurality of sections or embodiments as required, however, these sections or embodiments are not irrelevant to one another, but are in a relationship of exemplary modifications, details, supplementary description, and the like of a portion or all of one another, unless otherwise explicitly noted.

Also, in the following description of embodiments, when ref erring to the number of elements (including the number, value, quantity, range and the like), the elements are not limited to such number but may be more or less than the number unless otherwise explicitly noted, or unless they are apparently limited to particular numbers in principle, or the like.

Further, in the following description of embodiments, it goes without saying that components (including constituent steps and the like) are not necessarily essential unless otherwise explicitly noted, or unless they are apparently assumed to be essential in principle, or the like.

Similarly, in the following description of embodiments, when referring to the shapes, positional relationships and the like of components and the like, it is assumed that they also include those substantially approximate or similar to the shapes and the like, unless otherwise explicitly noted, or unless it is not so deemed in principle, or the like. The same applies to the value and range.

In all figures for describing embodiments, items having the same functions are designated the same reference numerals, and repetitive description thereon is omitted.

Now, embodiments of the present invention will be described below in detail with reference to the accompanying drawings.

(First Embodiment)

The present invention addresses systematic challenges associated with the lithography including all of the predecessor processing, development testing and regeneration processing which may cause a reduced apparatus efficiency and an increased TAT. Among others, the present invention involves connection of a development tester with a coater/developer to conduct a test and determination wafer by leaf after the development, and perform the regeneration within the coater/developer when the regeneration is required (hereinafter, called the "in-situ regeneration technique"). This enables the simultaneous realization of a higher efficiency and improved quality for resulting semiconductor integrated circuit devices.

First, the process leading to the present invention will be discussed below. For supporting the quality control (QC) in a flexible production, the present inventors considered the development of a QC integration for conducting a total inspection without TAT loss, wherein a development test (for alignment, dimensions, appearance) is connected to a coater/developer in an in-line configuration to conduct such a test in a pipeline operation. However, it is impossible to integrate a length measuring SEM (Scanning Electron Microscope) and an automatic appearance tester, which test the demintions. To overcome this, the test was replaced with a level management by a focus/exposure amount QC related to the dimensions, and incorporated into an alignment tester, while an appearance test was included in a conveyer system for the tester to limit a detection of sporadic failure factors which may occur in a lithography step. Also, the inventors decided to perform the regeneration in the coater/developer, and studied specifications for an in-line controller which realizes a highly flexible leaf flow control in order to control the predecessor, testing and regeneration with a least possible loss in an in-line pipeline operation. Through the studies on the hardware and software mentioned above, the inventors were able to realize novel technologies centered on the in-situ regeneration which resulted in the present invention.

Next, one exemplary technology studied by the inventors will be described. First, a resist film is coated on a main surface (device surface) of a wafer which is supplied from a pre-lithography step such as deposition. Subsequently, patterns are formed on the wafer by exposure and development, tested, and stored in a stocker. If a fail is determined as the result of the test, the resist is stripped off by a resist remover, working conditions are modified, and the wafer is again conveyed to the coater/developer to repeat the foregoing processing. Here, problems associated with the regeneration are, for example, as follows.

First, conveyance of wafers in units of lots is performed five times, i.e., between development and test, between the test and the stocker, between the stoker and resist removal, between the resist removal and washing, and between the washing and the coater/developer, so that a large TAT loss occurs due to a loss caused by stacking wafers, processed one by one, in a lot, and a loss caused by a waiting time until an apparatus in the next step can start working. Here, wafers are stored in the stocker between the test and the stoker because the resist removal and washing processing employ apparatuses for an etching step which are located far away from the lithography step.

Second, with an off-line test conducted for wafers introduced in units of lots, a total inspection would require a long time which causes a TAT loss and a long waiting waits, so that a sampling inspection is typically conducted. Since pass/fail is determined for a lot through the sampling inspection, all wafers in the lot is typically reproduced. Therefore, inherently good wafers are also included for wafers subjected to the regeneration, thereby causing a TAT loss required for the processing. Also, the coater/developer and an aligner suffer from a degradation in the substantial production efficiency because their processing times are allocated to extra works in units of lots. Further, since the TAT loss occurring at every turn causes subsequent lots to wait, the TAT loss propagates to the subsequent lots. This would further result in confused work scheduling, a pulsation in the flow, and a lower TAT and production efficiency, including other steps, unless appropriate measures are taken for recovery.

Third, an asher for removing a resist inevitably removes both of an anti-reflection film and a resist film because of its poor selectivity to these films. The washing does not either permit the anti-reflection film to remain. The damage caused by the asher and a change in film thickness of an underlying layer could result in a degraded quality. This also limits the number of times of regeneration.

Fourth, while a correction for the processing conditions during the regeneration processing is effective only for the same processing apparatus, a limitation of lot processing to a particular apparatus has a disadvantage in terms of scheduling. For example, when three or four cassette loaders generally possessed by a coater/developer are all engaged, the completion of works performed thereby must be awaited. Also, after processing a plurality of lots, a condition correcting accuracy is also degraded if an aligner is fed back from a log of the preceding processing. The reproductivity is also degraded by again processing from the coating of an anti-reflection film.

As described above, the regeneration processing studied by the present inventors not only multiply damages the TAT of the lots but also affects subsequent lots and other steps. This is not acceptable particularly for a flexible production of QTAT. Since a regeneration proportion depends on a required accuracy for products, it can be limited by ensuring a margin by a designing approach. However, seemingly, this would be difficult in the improvement on the performance of system LSIs, and miniaturization subsequent to the exposure technology using ArF excimer laser light. On the other hand, while the regeneration proportion has been limited by the predecessor processing, the production efficiency is degraded even in such a case in the technologies studied by the present inventors.

Next, one embodiment of the present invention for solving the foregoing problems will be described with reference to FIGS. 1 to 4. FIG. 1 explains the flow of processing a wafer 1 in a process of manufacturing semiconductor integrated circuit devices according to the embodiment. FIGS. 2 to 4 show enlarged cross-sectional views of a main portion of a wafer 1 in the respective processing steps in FIG. 1.

Figure 2A:
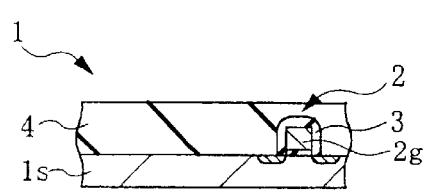
FIG. 2A is an enlarged cross-sectional view showing a main portion of a semiconductor wafer in the respective processing steps in FIG. 1.

A cassette C1 stores a plurality of wafers 1 in one lot after the completion of a pre-lithography step such as a deposition step. FIG. 2A shows an enlarged view of a main portion of a wafer 1 in the cassette C1. A semiconductor substrate is forming part of the wafer 1 is made of a semiconductor material, for example, silicon single crystal or the like, and, though particularly limited, is formed on its main surface (device surface) with an element 2, for example, MIS·FET (Metal Insulator Semiconductor Field Effect Transistor), which represents a field effect transistor, or the like. The MIS·FET may be an n-channel type or a p-channel type. Though not particularly limited, a gate electrode $2g$ of the MIS·FET is comprised, for example, of low resistance polysilicon and a silicide film deposited on the polysilicon, such as tungsten silicide, cobalt silicide or the like. The gate electrode 2g has its surface covered with an insulating film 3 made, for example, of a silicon oxide film or the like. Further, on the main surface of the wafer 1, an interlayer insulating film 4 made, for example, of a silicon oxide film or the like is deposited to overlie the MIS·FET. Here, the top surface of the interlayer insulating film 4 is planarized, for example, by chemical mechanical polishing (CMP) or the like. The wafers in the cassette C are removed one by one and subjected to respective processing one by one.

Figure 2B:
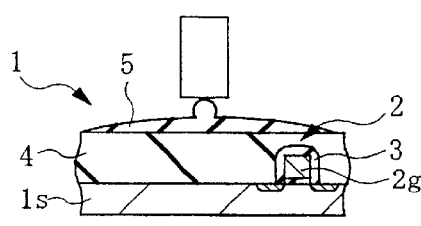
FIG. 2B is an enlarged cross-sectional view showing a main portion of a semiconductor wafer in the respective processing steps in FIG. 1.
Figure 2C:
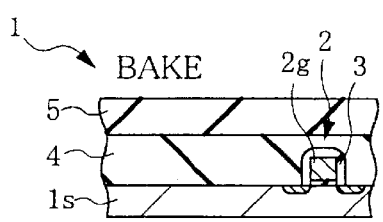
FIG. 2C is an enlarged cross-sectional view showing a main portion of a semiconductor wafer in the respective processing steps in FIG. 1.

First, as shown in FIG. 1 and FIGS. 2B and 2C, after an anti-reflection film 5 is coated on the main surface of the wafer 1, the wafer 1 is baked at relatively high temperatures. The anti-reflection film 5 formed in this manner is refractory to a solvent such as thinner. The anti-reflection film 5 functions as a protection layer for the underlying components during the regeneration, as described later, in this embodiment, in addition to a layer for preventing reflection from the underlying layer to prevent standing waves from occurring within a resist film during exposure. For this reason, the use of the anti-reflection film is described as desirable in the embodiments of the present invention. However, the anti-reflection film may be omitted if the resolution and dimensional accuracy are not required, or if the surface of the substrate need not be protected, in which case the remaining processing remains identical.

Figure 2D:
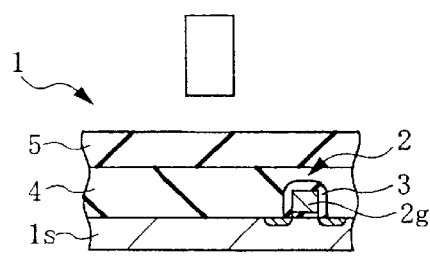
FIG. 2D is an enlarged cross-sectional view showing a main portion of a semiconductor wafer in the respective processing steps in FIG. 1.
Figure 2E:
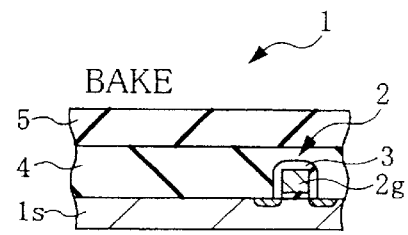
FIG. 2E is an enlarged cross-sectional view showing a main portion of a semiconductor wafer in the respective processing steps in FIG. 1.

Next, as shown in FIG. 1 and FIG. 2D, the surface of the anti-reflection film 5 is applied with an HMDS (hexamethyle disilazane) treatment to modify the processed surface of the anti-reflection film 5 to improve the adhesivity to a resist film. HMDS is a type of surface-active agent which can be expressed as $(CH_3)SiNHSi(CH_3)_3$ in chemical formula. In the lithography step in the process of manufacturing semiconductor integrated circuit devices, HMDS is an adhesion reinforcer used for improving the adhesivity between the wafer 1 and a resist film, and for processing, is evaporated and coated on the main surface of the wafer 1. In this manner, the surface of the anti-reflection film 5 is modified. Subsequently, the wafer 1 is baked as shown in FIG. 1 and FIG. 2E. It should be noted that the HMDS treatment may not be required for the surface of the anti-reflection film, whereas the HMDS treatment is essential in a step in which no anti-reflection film is coated. It can be applied as well when no anti-reflection film exists by considering this processing.

Figure 2F:
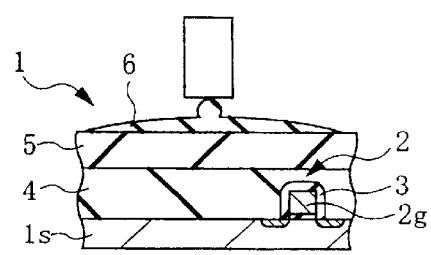
FIG. 2F is an enlarged cross-sectional view showing a main portion of a semiconductor wafer in the respective processing steps in FIG. 1.
Figure 2G:
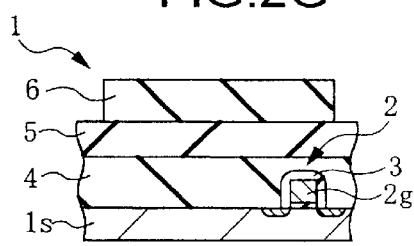
FIG. 2G is an enlarged cross-sectional view showing a main portion of a semiconductor wafer in the respective processing steps in FIG. 1.
Figure 3A:
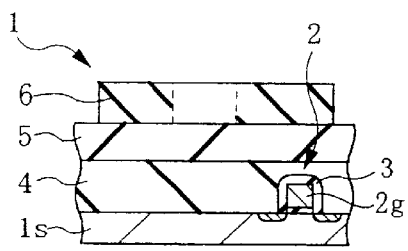
FIG. 3A is an enlarged cross-sectional view showing a main portion of a semiconductor wafer in each of processing steps subsequent to those of FIG. 2 in the flow of FIG. 1.
Figure 3B:
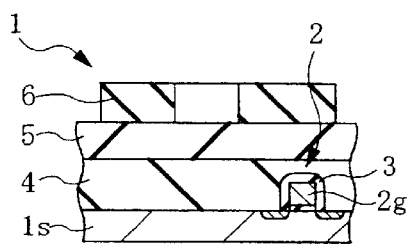
FIG. 3B is an enlarged cross-sectional view showing a main portion of a semiconductor wafer in each of processing steps subsequent to those of FIG. 2 in the flow of FIG. 1.

Next, as shown in FIG. 1 and FIGS. 2F and 2G, a positive-type resist film (photosensitive organic film) 6 is coated on the anti-reflection film 5, and the wafer 1 is subjected to pre-bake processing. Subsequently, as shown in FIGS. 1 and 3A, the wafer 1 is passed to an aligner EXP for a transfer of patterns through exposure processing. An exposure method used herein may be represented by a step and scan method or a step and repeat method. Subsequently, as shown in FIGS. 1 and 3B, the wafer 1 is again sent back to the coater/developer for baking. This is a treatment for providing effects such as amplification of a chemically amplified resist film, averaging of standing waves for a non-chemically amplified resist film, and the like.

Figure 3C:
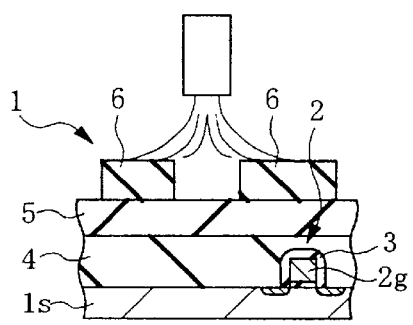
FIG. 3C is an enlarged cross-sectional view showing a main portion of a semiconductor wafer in each of processing steps subsequent to those of FIG. 2 in the flow of FIG. 1.
Figure 3D:
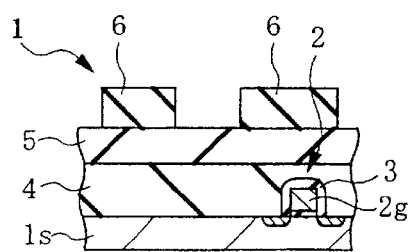
FIG. 3D is an enlarged cross-sectional view showing a main portion of a semiconductor wafer in each of processing steps subsequent to those of FIG. 2 in the flow of FIG. 1.

Next, as shown in FIG. 1 and FIGS. 3C and 3D, the wafer 1 is applied with development processing and post-baking to form a pattern of the positive-type resist film 6, followed by a development test as shown in FIG. 1. In this development test, the wafer 1 is passed to a development test processing unit which conducts, for example, an alignment test (optical measurement), a dimensional accuracy test, an appearance test, and the like. When determined as falling within the criteria in the development test (step 100 in FIG. 1), the wafer 1 is stored in a cassette C2. On the other hand, when determined as falling out of the criteria (step 100 in FIG. 1), the wafer 1 is sequentially passed to the regeneration processing. In this case, information such as errors measured by the tests, or detected defects and irregularities is converted to correction values such as exposure conditions to be applied to the associated processing units. Thus, the correction values are provided to the respective processing units (step 101 in FIG. 1). This conversion involves, for the alignment test, parameterizing a distribution of errors on the wafer 1 based on an approach such as a statistical model, and converting the parameters to control manipulation amounts possessed by the aligner. Here, the modification of the processing conditions is positioned before the regeneration after the determination of the test results for convenience of explanation. However, in a system which combines the present invention, later described, with the predecessor processing and failure detection to control the flow on a wafer-by-wafer basis to optimize the correction in real time, it is also contemplated to locally make corrections at various points in time (in the order of processing steps or wafers), including as well monitored data of the log of works detected by the respective processing.

Figure 4A:
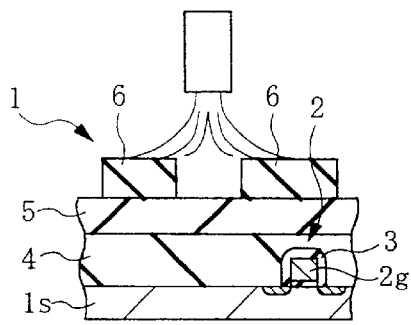
FIG. 4A is an enlarged cross-sectional view showing a main portion of a semiconductor wafer in each of processing steps subsequent to those of FIG. 3 in the flow of FIG. 1.
Figure 4B:
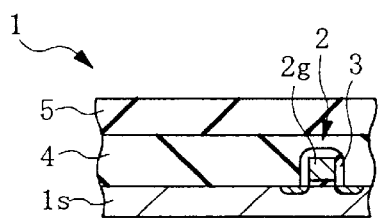
FIG. 4B is an enlarged cross-sectional view showing a main portion of a semiconductor wafer in each of processing steps subsequent to those of FIG. 3 in the flow of FIG. 1.
Figure 4C:
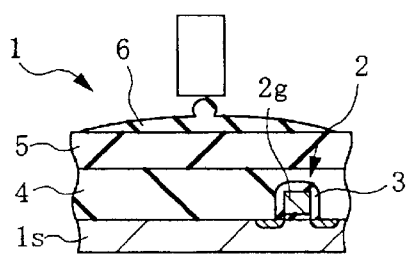
FIG. 4C is an enlarged cross-sectional view showing a main portion of a semiconductor wafer in each of processing steps subsequent to those of FIG. 3 in the flow of FIG. 1.
Figure 4D:
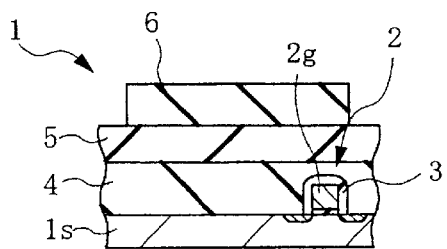
FIG. 4D is an enlarged cross-sectional view showing a main portion of a semiconductor wafer in each of processing steps subsequent to those of FIG. 3 in the flow of FIG. 1.

Next, the regeneration processing according to this embodiment proceeds, for example, in the following manner. First, a wafer 1 determined as falling out of the criteria in the development test is conveyed to the processing unit for coating a resist film, as shown in FIG. 1. This processing unit has a nozzle for dropping or spraying thinner (solvent) onto the main surface of the wafer 1 in addition to a nozzle for dropping the resist film. The wafer 1 is rotated horizontally on a spinner on the main surface of the wafer 1 while the thinner is dropped or sprayed onto the surface of the wafer 1 as shown in FIG. 4A. In this manner, the thinner flows radially toward the periphery of the main surface of the wafer 1, while solving the resist film 6, and removes the positive-type resist film. After the positive-type resist film 6 has been fully removed, the thinner is dropped to wash the surface of the wafer 1. After the wafer 1 is sufficiently washed, the dropped thinner is stopped, and the wafer 1 is rotated to remove the thinner, as shown in FIG. 4B. In this case, the thinner remaining on the main surface (i.e., on the anti-reflection film 5) of the wafer 1 is not completely dried but left slightly on the main surface. In this manner, the thinner is slightly left on the surface of the wafer 1. This stage is identical to the completion of the step shown in FIG. 2E, where the surface modification effect of the anti-reflection film 5 is still maintained. Subsequently, as shown in FIG. 4C, the resist film 6 is again coated on the anti-reflection film 5. In this case, the wettability of the resist film 6 is improved to uniformly provide the flow of the resist film 6 and the formation of the film by virtue of the thinner component slightly left on the surface of the anti-reflection film 5. For this reason, the resist film 6 can be evenly coated over the entire main surface of the wafer 1 even if a small amount of resist film 6 is dropped. Thus, since the amount of dropped resist film 6 can be reduced, the cost can be reduced (application of resist saving technique). Also, in this regeneration processing, the management of waste liquid and chemical resistance of materials within a processing chamber can be maintained, so that another chemical for washing or the like may be applied alone or in combination with the thinner. Subsequently, the wafer 1 is subjected to the pre-bake processing as shown in FIGS. 1 and 4D. In this case, the pre-bake processing also dries the thinner component remaining between the anti-reflection film 5 and the resist film 6, so that the resist film 6 can be adhered to the anti-reflection film 5 with a good adhesivity without the influence of the thinner. It should be noted that the solvent is not limited to the thinner, but may be changed to any of various alternatives. For example, aceton, trichloroethylene, benzenesurforic acid, or a deep developer may be used instead.

Figure 5:
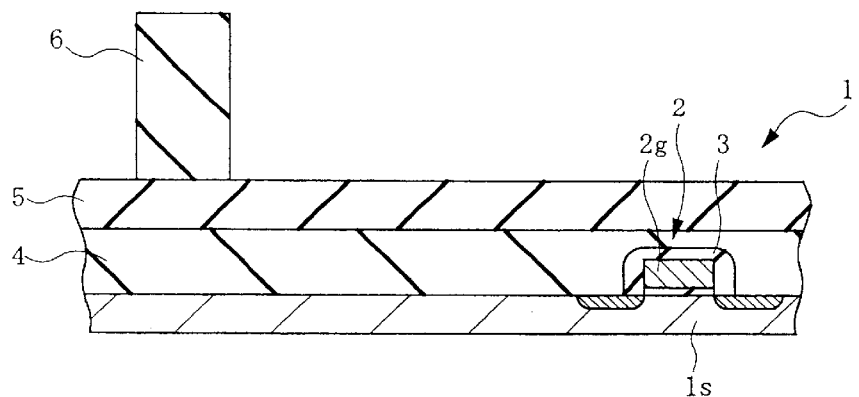
FIG. 5 is a cross-sectional view of a main portion of a semiconductor wafer for explaining a function of an anti-reflection film formed on a main surface of a semiconductor wafer in the process of manufacturing semiconductor integrated circuit devices in FIG. 1.

Here, with respect to the foregoing regeneration processing, the function of the anti-reflection film 5 will be described with reference to FIGS. 5 and 6. FIG. 5 shows an enlarged cross-sectional view of a main portion of a non-standard wafer 1 before the regeneration processing. As described above, the top surf ace of the interlayer insulating film 4 is planarized. On the top surface of the interlayer film 4, the anti-reflection film 5 is deposited. The top surface of the anti-reflection film 5 is planarized, absorbing slight underlying ruggedness. Then, the positive-type resist film 6 is patterned on the anti-reflection film 5.

Figure 6A:
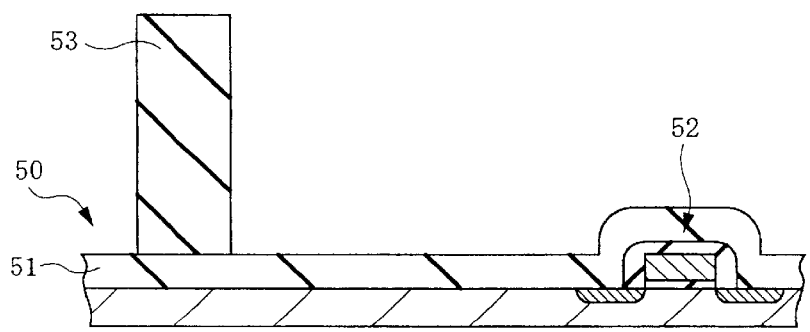
FIG. 6A is a cross-sectional view of a main portion of a semiconductor wafer for explaining failures in the technologies investigated by the present inventors.
Figure 6B:
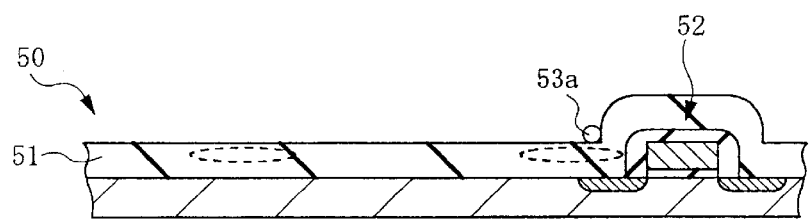
FIG. 6B is a cross-sectional view of a main portion of a semiconductor wafer for explaining failures in the technologies investigated by the present inventors.
Figure 6C:
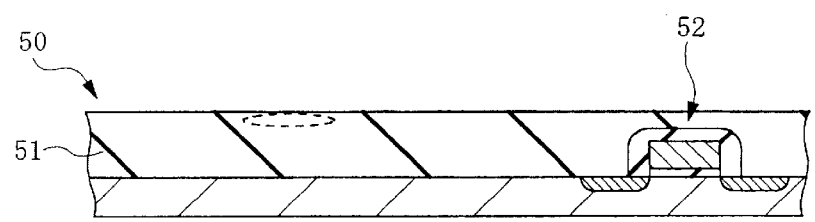
FIG. 6C is a cross-sectional view of a main portion of a semiconductor wafer for explaining failures in the technologies investigated by the present inventors.

On the other hand, FIGS. 6A to 6C show exemplary wafers without anti-reflection film for comparison. FIG. 6A shows an exemplary wafer 50 which has an interlayer insulating film 51 deposited on the main surface thereof, the top surface of which is not planarized. On the top surface of the interlayer insulating film 51, a step caused by an MIS/FET 52 on the main surface of the wafer 50 appears. Also, a pattern on the resist film 53 is formed as directly contacted on the interlayer insulating film 51. FIG. 6B shows a problem which arises when the resist film 53 in FIG. 6A is removed by the regeneration processing. Illustrated in FIG. 6B are problems such as a foreign particle 53a attached at a corner of the step on the top surface of the interlayer insulating film 51, such as a residue of the resist film 53, contamination, change in the surface state, and the like as indicated by broken lines on the top surface of the interlayer insulating film 51 due to the removal of the resist film 53, and the like. FIG. 6C shows that even with a planarized top surface of an interlayer insulating film 51, contamination, surface state change and the like have resulted from the removal of a resist film as indicated by broken lines on the top surface of the interlayer insulating film 51.

On the contrary, in this embodiment, as shown in FIG. 5, the anti-reflection film 5 deposited on the interlayer insulating film 4 can reduce the step on the interlayer insulating film 4 and improve the planarity of the underlying layer of the resist film 6, thereby preventing the foreign particle 54 from remaining, and improving the washing effect.

Also, since the anti-reflection film 5 is removed after etching, the underlying layer is protected except for the influence exerted by the removal of the anti-reflection film 5. Specifically, since the anti-reflection film 5 on the main surface of the wafer 1 protects the underlying interlayer insulating film 4 when the resist film is removed by the thinner for the regeneration processing, the anti-reflection film 5 can prevent the interlayer insulating film 4 from being damaged or deteriorated by the thinner or the like. As such, repetitions of the regeneration processing is permitted because the influence of the regeneration processing need not be taken into consideration. Conventionally, repeated execution of the regeneration processing a plurality of times has been out of consideration due to a large loss caused by the regeneration, and damages received by the regeneration processing. According to this embodiment, however, the regeneration processing can be performed with a slight loss and small damages, thereby making it possible to automate the processing on the promise of the regeneration (for detecting conditions), which has been so far unavailable, and the processing using the same wafer again and again by repeating the regeneration (for testers and the like)

Also, the present inventors have confirmed that a change in the film thickness of the anti-reflection film 5 can be substantially eliminated while the thinner is being dropped for the regeneration processing. Specifically, according to this embodiment, since the anti-reflection film 5 formed on the main surface of the wafer 1 maintains the same state as that which is coated for the first time, the reproductivity can be improved in coating, exposing and developing the positive-type resist film 6 in the regeneration processing. For this reason, when the conditions for the regeneration processing are corrected based on the first development test, patterns can be formed in a higher accuracy than a statistically predicted one. Looking to this aspect, the inventors also propose in this embodiment a combination of two methods in which other wafers 1 are corrected by an algorithm that utilizes appropriate statistical processing, while regenerated wafers are corrected for errors which were detected in the preceding result.

Also, from the fact that the anti-reflection film 5 does not change in state before and after the regeneration processing, this embodiment is capable of performing the regeneration processing in the same processing chamber through a sequence of continuous operations. The regeneration processing performed sequentially in the same processing chamber is desirable in terms of the cost as well as the throughput. One thing to be considered herein is the HMDS treatment which is performed before coating the resist film 6 in the first processing. The HMDS treatment is performed in a processing chamber different from that in which the resist film 6 is coated. For this reason, when the HMDS treatment is performed, the wafer 1 must be reciprocally conveyed between the processing chambers for removing the thinner from the resist film 6 within a resist coating bowl, for the HMDS treatment, and for coating the resist in the resist coating bowl. This causes a subsequent wafer 1 to wait for the processing (though it is not impossible to so perform), in which case the implementation may be difficult in an apparatus which relies on a pipeline processing for a higher efficient of processing. Even with a configuration having a series of two coating bowls, this would differ from normal processing.

On the contrary, in this embodiment, when the anti-reflection film has a high adhesivity to a resist or when the surface of the anti-reflection film is modified by the HMDS treatment as described above, the effect of the anti-reflection film will not be damaged by the thinner, as actually making good showing in the resist saving technique. Therefore, if exceptions are excluded in the regeneration processing after the first processing has been performed, there must be conditions under which the modification effect remains during a certain number of times of regeneration processing. Within this range of conditions, the resist film 6 can be coated sequentially from the removal of thinner, while omitting the HMDS treatment. It is therefore possible in this embodiment to carry out an efficient in-line pipeline operation without causing a large delay or a wait. Also, when the adhesivity of the anti-reflection film is degraded or when no anti-reflection film is used, a method according to a third embodiment, later described, may be used to carry out satisfactory processing when the HMDS treatment is required in the regeneration processing.

After the regeneration processing as described above, the wafer 1 undergoes repeated regeneration processing until it falls within the criteria after passing through the exposure, baking, development processing, post-baking and development test. Then, the wafer 1 is stored in the cassette C2 when it satisfies the criteria.

In the embodiment which is capable of performing the regeneration processing as described above, all the wafers 1 are inspected within a sequence of processing from the introduction of a lot into the coater/developer to the removal of the lot from the coater/developer after the wafers 1 have been processed. Those wafers 1 which fail to satisfy the criteria at the first time are highly accurately corrected by the regeneration processing into good wafers 1 which are then stored in the cassette C2. While FIG. 1 shows the order in which the same wafer 1 is processed, the present invention is not limited to the shown order, but wafers for different products (or in different lots), for example, may be processed on the same line. In this case, those of first wafers 1 which fail to satisfy the criteria may only be processed in a pipeline manner in parallel with the processing for second wafers, different from the first wafers 1, thereby limiting a resulting delay to a slight amount.

Also, since the processing after the regeneration is performed in the sequence of processing for the same lot, a high reproductivity is provided in the first and second processing, and a correction made to the processing conditions is correctly reflected. For this reason, a re-test may be omitted as the case maybe, for example, as indicated by a dotted line in FIG. 1.

In the process of manufacturing semiconductor integrated circuit devices, the removal of a resist film with the thinner is used as a simple method of removing a resist in some cases. However, since its removing ability is inferior as compared with an asher or a dedicated parting agent, such a method should be limitative in relation to the application to a test wafer and the underlying layer from concerns such as an insufficient removing effect at the step of the underlying layer, by way of example. In addition, since the method of removing the resist film using the thinner can be applied in sequential processing in the same processing unit as that for coating a resist film because of its convenience, as described later, and is simple in waste disposal because of its sameness as wastes produced in the resist film coating step, this is an optimal resist removing means for the in-situ regeneration technology.

Also, in the flow of technologies studied by the inventors, the resist film removal processing is performed in units of lots with an asher replaced with a coater/developer, so that the efficiency of the coater/developer is simply degraded with the problems remaining unsolved. This embodiment, on the other hand, provides the processing in units of wafers, and a total inspection and regeneration for nonstandard wafers would not cause lots of wafers to wait, thereby making it possible to improve the efficiency of manufacturing semiconductor integrated circuit devices.

Likewise, the anti-reflection film is also a technology used in a step which requires a high accuracy, particularly, in terms of dimensional accuracy. In this embodiment, the anti-reflection film is provided within the concept of the in-situ regeneration technology. Specifically, as described later, the anti-reflection film is utilized in a novel system construction with attention focused on significant effects such as the selectivity associated with the removal from the resist layer, protection for an underlying layer, and the reproductivity of a correction for the processing condition during the regeneration. However, the in-situ regeneration technology of the present invention may be applied to a step in which no anti-reflection film can be applied due to problems in an etching step, and to a step in which a resist mask is formed for an ion implantation step in which no anti-reflection film is used. In this case, since the adhesivity of the resist film to an underlying layer is lower than that of the anti-reflection film to the resist film, the aforementioned HMDS treatment is required again. In addition, peeling and washing effects maybe be insufficient in relation to the underlying layer. In such a situation, another parting agent and post-washing may be required. Ina rare case, nonstandard wafers alone may be processed using another processing apparatus after a total inspection for wafers, with a small influence. However, if a problem arises, spin washing may be added to the coater/developer to perform the in-situ regeneration in a similar manner using the special chemicals to implement many subsequent applications.

The flow of FIG. 1 is limited only to parts essential to the description on the principles of the present invention. Parenthesized processing inserted in FIG. 1 indicates an exemplary application for improving the reliability of this embodiment of the present invention. For example, an in-line film thickness test may be conducted after the resist coating and pre-baking. This is because there is a case that it is difficult to measure the film thickness after forming patterns. Also, a rear surface washing unit may be added for washing the rear surface of a regenerated wafer 1 after a development test to add washing. This washing is added because an increased amount of foreign particles may be attached on the rear surface of the wafer 1 after a sequence of coating—exposure—development—test, and the foreign particles could give rise to defocusing during exposure for the regeneration. These foreign particles may possibly be introduced in the pre-lithography step, as attached on the rear surface of the wafer 1, and collected thereon. Essentially, the foreign particles should be washed away from the rear surface before coating the anti-reflection film in the first processing, or immediately before the exposure which would be affected by the foreign particle in order to eliminate the maintenance for a long term. Also, peripheral exposure is processed before or after exposure, and processing for removing an unnecessary portion of the positive-type resist film around the periphery at the time of development may be integrated as processing before exposure due to requirements for the orientation of the wafer 1, similarly to a film thickness test, to perform simultaneously.

When the present invention is applied to the coater/developer, a leaf flow control is required for controlling the processing on the wafers 1 one by one. While the leaf control has not been applied on a full scale on LSI (Large Scale Integrated circuit) production lines, this is regarded as an important method of producing wafers 1 having a diameter of approximately 300 mm. Currently, standardization for the leaf control is under investigation in SEMI (Semiconductor Equipment and Material Inter-nation). Control specifications called GEM (General Equipment Model) 300 viewed from a host have been proposed, and gradually applied to systems. However, there has not yet existed any apparatus which can control waits in individual processing units or locations for each wafer, or resumption of processing in recent correction conditions, as described in embodiments of the present invention. It is however contemplated that such flexible control will be gradually realized as a technical trend. Here, a variety of implementations of the leaf control will be illustrated. These implementations are studied for determining how subsequent wafers 1 are waited when a wafer 1, determined for regeneration, is returned to a resist film coating bowl to remove a resist film, or how the management of the processing order with other wafers 1 is controlled.

Figure 7:
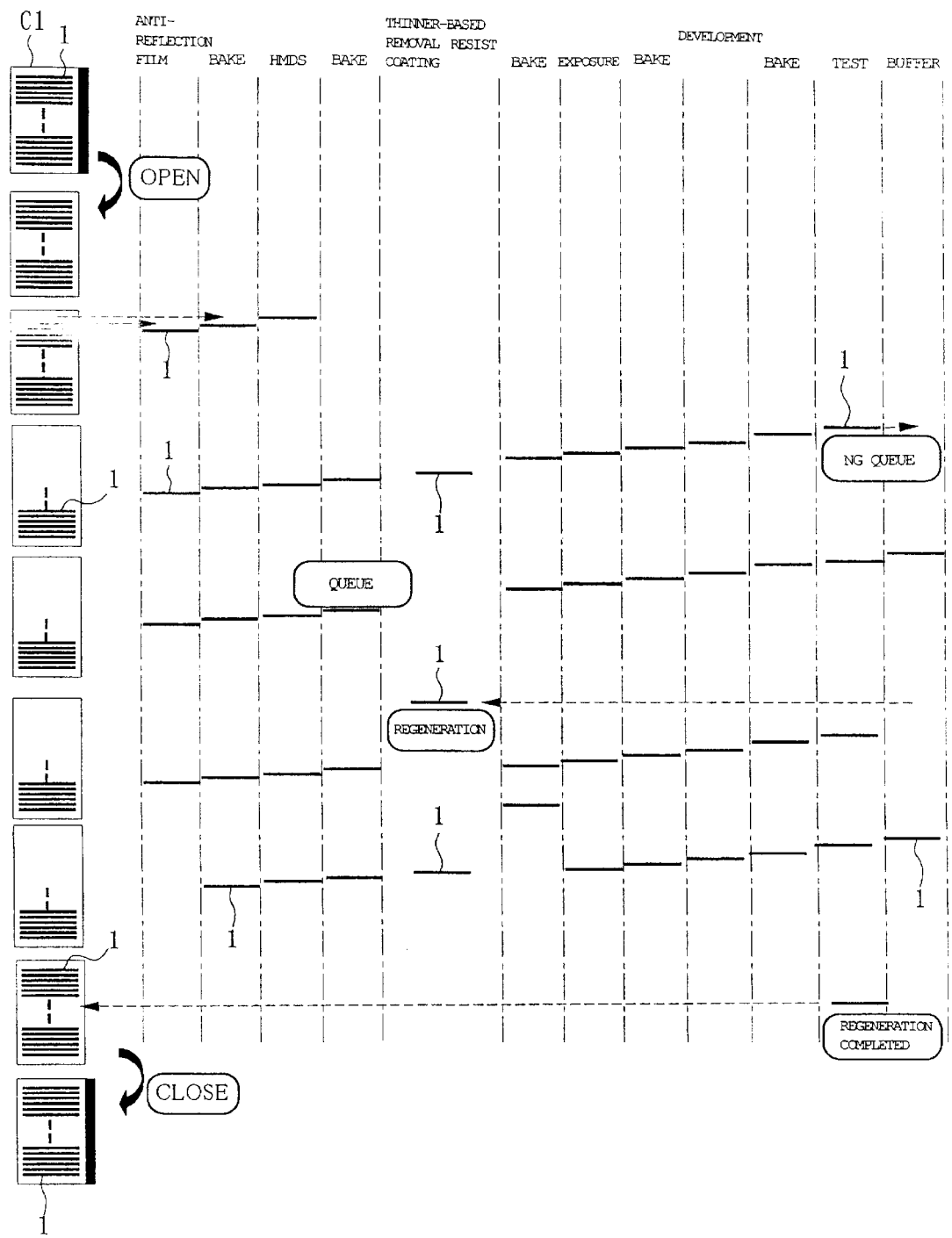
FIG. 7 is an explanatory diagram of an exemplary implementation for performing the regeneration processing broken into subsequent semiconductor wafer processing in the flow of FIG. 1.

FIG. 7 shows an example of how the regeneration processing is broken into the processing for a subsequent wafer 1. First, in a sequence of processing in the lithography step, the processing must be performed at regular time intervals. This is because a variety of reactions advance within a resist film, particularly prominent for a chemically amplified resist, even at a room temperature, or depending on a log of increasing and decreasing the temperature. Also, since a change may occur due to a trace of chemical components in the atmosphere and affect variations in line width, the processing time intervals should be made constant to make the change constant, thereby making it possible to adjust with a correctable condition such as the amount of exposure. The change is most sensitive after the baking after the exposure, and second most sensitive after the exposure, and third most sensitive after coating a resist film. No influence is exerted before coating a resist or after development, and the change is relatively stable even after the coating due to an improved resist film. Therefore, when a regenerated wafer is returned to the resist coating bowl which starts the regeneration processing, wafers before a resist film is coated thereon, i.e., those wafers which exist in processing units until the HMDS treatments in the so far described flow, may be left waited from the removal of resist from wafers subjected to the regeneration to the completion of resist coating, and even after the processing terminates at their respective positions, without any problem arising in terms of the quality. Therefore, a wafer which is next tested and determined as should be regenerated in succession may be left waited in continuation.

When the regeneration occurs in this manner, immediately after a subsequent wafer 1 has been processed in the resist coating bowl, a wafer 1 subjected to the regeneration is conveyed to the resist coating bowl, and the resist is removed using the thinner, thereby performing in-line pipeline processing without waste time until the subsequent wafer 1 arrives.

Since this method proceeds in a seamless manner and does not require a buffer for waiting buffers, the feature of the present invention appears most explicitly in this method. However, this method involves a change in an order in which wafers 1 are removed from the cassette 1, a processing order, and an order in which the wafers 1 are stored in the cassette Cl due to the regeneration. Since it is assumed that the apparatus considered by the inventors does not involve a change in position and processing order of the wafers 1, software for the coater/developer is forced to a large change.

Figure 8:
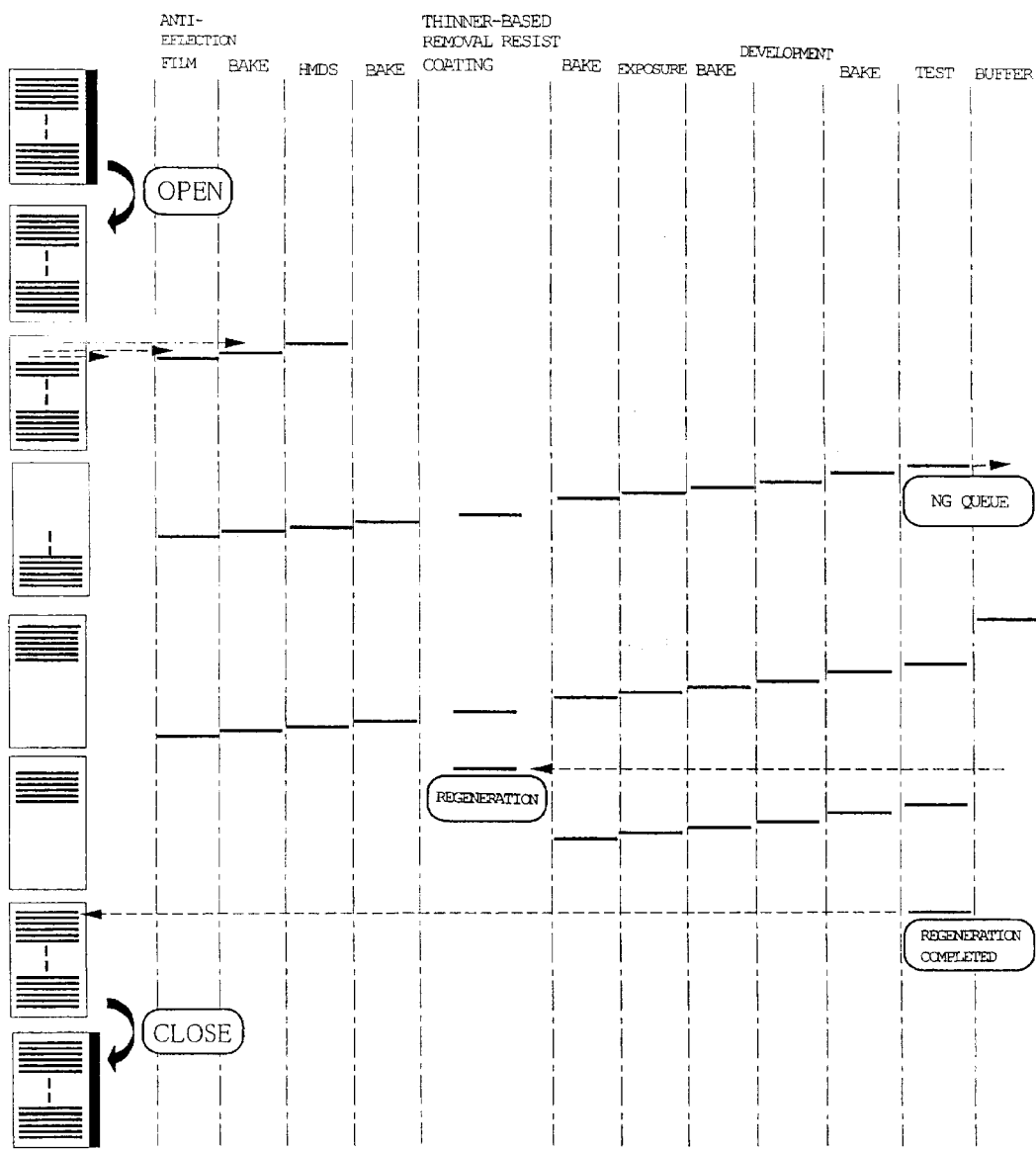
FIG. 8 is an explanatory diagram of another exemplary implementation for performing the regeneration processing broken into subsequent semiconductor wafer processing in the flow of FIG. 1.

FIG. 8 shows another processing method. In this method, a wafer 1 which requires the regeneration waits in a buffer until the first processing is complete for all wafers 1 in the same lot within the cassette C1.

After the resist film coating processing has been completed for the last wafer 1 in the lot, the wafers 1 are conveyed from the buffer to the resist coating bowl. In this method, the first processing is collectively performed in an order in which the wafers 1 are removed from the cassette. Since the regeneration processing is likewise performed only on pertinent wafers 1 in the order in which the first processing is performed, management software can be applied without significant changes. In this case, the processing on wafers 1 in the next cassette C1 cannot be started until the regeneration processing on the last wafer 1 terminates, leading to a disadvantage that the processing cannot be continuously performed in a transition to the next lot. However, the first one or plural wafers 1 in a lot maybe processed until a development test in advance, and information acquired therefrom may be fed back as processing information for subsequent wafers 1 for correction, thereby significantly reducing the probability that a subsequent wafer 1 should be regenerated. In this case, as shown in FIG. 8, a lot to be next processed waits for the completion of the HMDS treatment, and is released from the wait after the regeneration processing has fully terminated for the wafers 1 which were determined as should be regenerated in the predecessor processing. In this manner, a transition from one lot to another can be minimized. In this case, while additional regeneration processing may be required for subsequent wafers 1 and wafers for regeneration, the wafers are once returned to the cassette C1 and processed after the next lot for simplifying the processing order for the wafers 1.

Next, a method of using a slot in the cassette 1 at which the regenerated wafer 1 has originally been set as a buffer most matches the standard specifications for the aforementioned GEM 300. The GEM 300 has a function of changing a job wait such that the regeneration processing in this embodiment and the aforementioned post-processing can be performed in succession in specifications related to a control job and management for a process job. Since the degree of reduction in the transition between cassettes and between lots depends on the flexibility of the leaf flow control implemented in a particular apparatus, the first method described in connection with FIG. 7 enables the most efficient processing, though details are not described here. This method has a function of changing the processing flow on a leaf basis without dependence on the order of processing at the time the processing on the wafers 1 is started to circulate the wafers through cut-in; a function of waiting subsequent wafers 1 and releasing them from the wait in accordance with the processing flow; and a function of appropriately correcting the processing conditions while controlling the processing order of wafers 1 which dynamically changes in the manner as mentioned. Though such a leaf flow control appears to be difficult, it is actually not so difficult. It has been found from studies of the inventors that the leaf flow control conforms to realistic specifications within optional specifications which are abstractly required in the standard specifications for GEM 300, particularly, STS (Substrate Tracking System), OSS (Object System Service), CJM (Control Job Management), PJM (Process Job Management), and the like.

Figure 9:
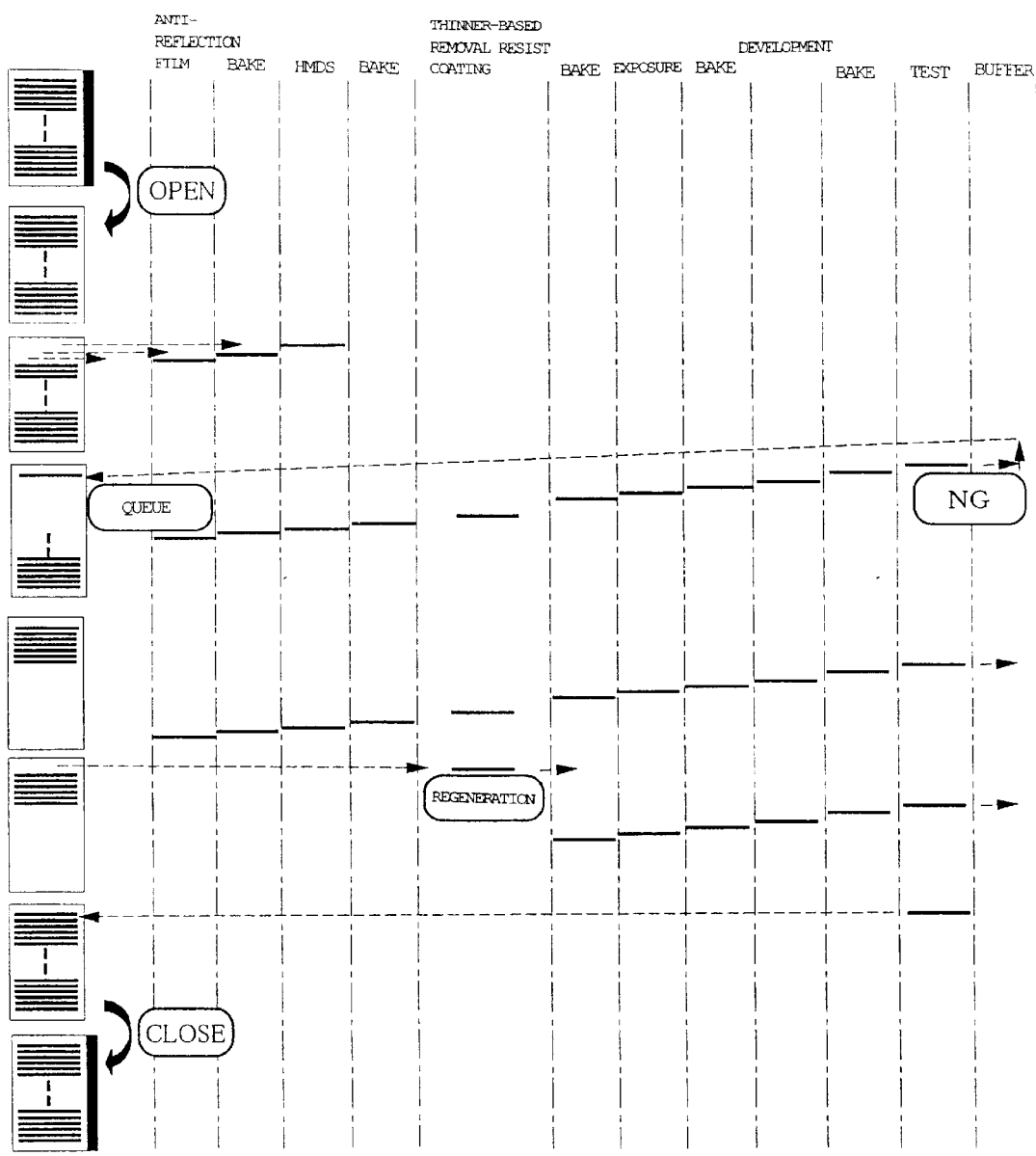
FIG. 9 is an explanatory diagram of a further exemplary implementation for performing the regeneration processing broken into subsequent semiconductor wafer processing in the flow of FIG. 1.

In this manner, as a conveniently effective method for implementing the present invention in an apparatus conforming to conventional specifications, there is proposed a method of returning a wafer once to a cassette such that a slot in the cassette is used as a buffer. This however is not a deviation from a method of regenerating a wafer within the processing for one cassette in accordance with the present invention. To clarify this aspect, FIG. 9 shows that the processing completely terminates between opening and closing of an open/close lid of the cassette C1. This also permits a temporal shift of a subsequent lot to the completion of the processing, for example, for performing the regeneration processing. It is also contemplated that the open/close lid is opened and closed between the first processing and the regeneration processing. However, it is proposed herein that essentially, the cassette is conveyed to a loader for starting the processing, and the regeneration processing has terminated by the time the cassette is conveyed to a step after the lithography step after the processing has terminated. Also, this includes a case where an off-line test is conducted other than the consistent test in this proposal, and the regeneration is performed in the removal of a resist film using the thinner, if required. According to the present invention, since the regeneration processing determined as required by the off-line test will be very infrequent, such an off-line test is also acceptable in the production.

Figure 10:
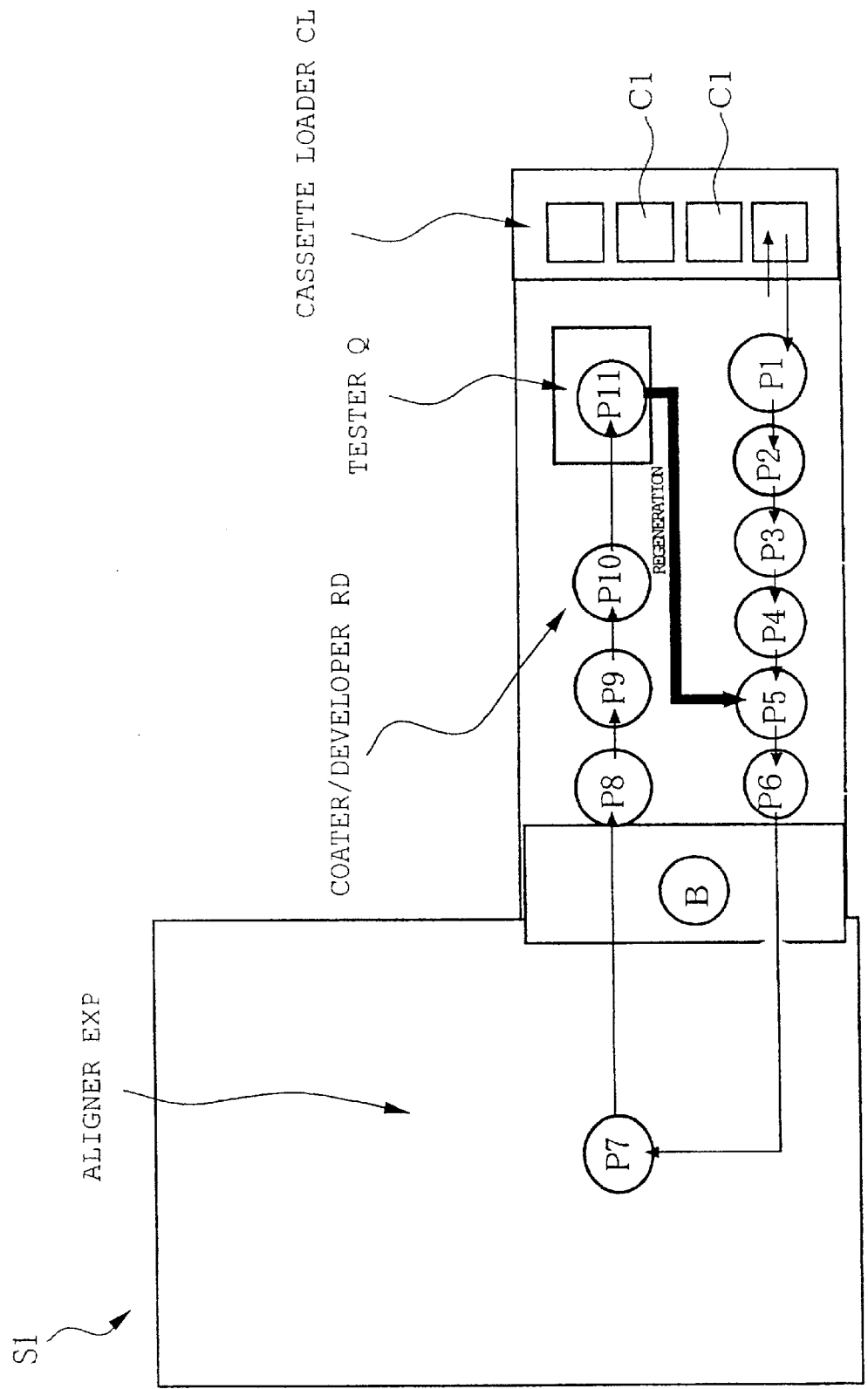
FIG. 10 is an explanatory diagram of an exemplary semiconductor manufacturing apparatus used in the method of manufacturing semiconductor integrated circuit devices in the flow of FIG. 1.

FIG. 10 shows an exemplary configuration of a semiconductor manufacturing apparatus S1 for implementing the in-line pipeline operation according to this embodiment (first system). The semiconductor manufacturing apparatus S1 comprises a cassette loader CL, a coater/developer RD, an aligner EXP, and a tester Q. The cassette Cl is loaded in the cassette loader CL. Processing chambers P1–P11 perform the foregoing processing steps. Specifically, the processing chamber P1 is a chamber in which the anti-reflection film is coated; the processing chamber P2 is a bake processing chamber after coating the anti-reflection film; the processing chamber P3 is the HMDS treatment chamber; the processing chamber P4 is a bake processing chamber after the HMDS treatment; the processing chamber PS is a processing chamber for coating a resist film and removing a resist film using thinner; the processing chamber P6 is a bake processing chamber after coating the resist film; the processing chamber P7 is an exposure processing chamber for the aligner EXP; the processing chamber P8 is a bake processing chamber after the exposure processing; the processing chamber P9 is a development processing chamber after the exposure processing; the processing chamber P10 is a bake processing chamber after the development processing; and the processing chamber P11 is a test chamber within the tester Q, respectively. The processing chambers P1 to P11 are connected in series. The processing on a wafer is advanced in the order of the processing chambers P1 to P11, as mentioned above. A buffer region B is interposed before and after the processing chamber P7 of the aligner EXP. Here, the processing chamber P11 of the tester Q is positioned within the coater/developer RD. A wafer determined as failing to satisfy the criteria by the tester Q integrated with the coater/developer RD is conveyed to the processing chamber P5. Then, the regeneration flow is executed in the processing chamber P5 as described above. In this way, a processing loop is formed.

Figure 11:
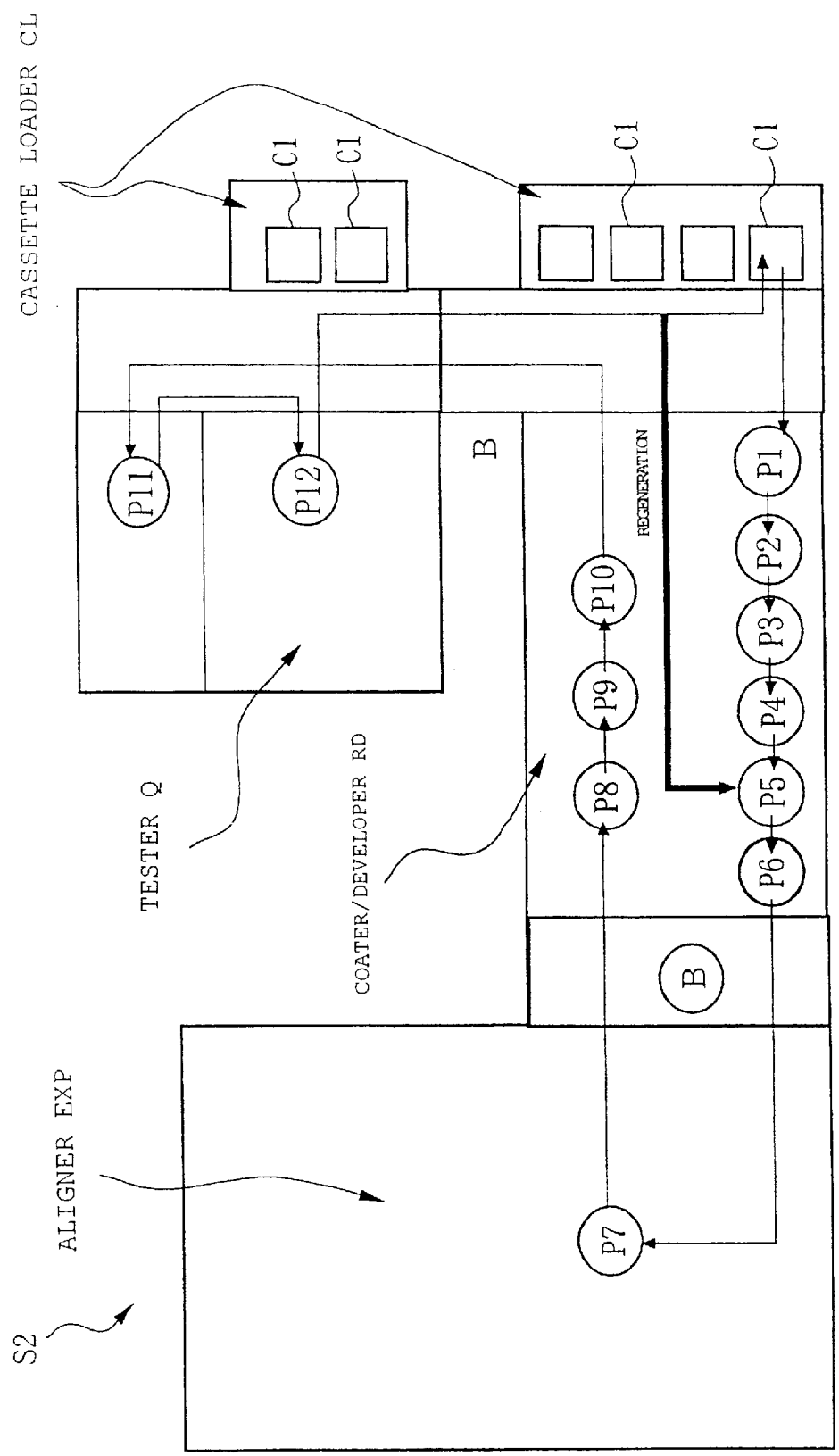
FIG. 11 is an explanatory diagram of another exemplary semiconductor manufacturing apparatus used in the method of manufacturing semiconductor integrated circuit devices in the flow of FIG. 1.

FIG. 11 in turn shows an improved example (second system) which provides a higher effectiveness than the semiconductor manufacturing apparatus S1 in FIG. 10. A semiconductor manufacturing apparatus S2 in FIG. 11 passes and receives wafers at the coater/developer RD through a single interface, where a plurality of processing chambers P11, 12 for testing in the tester Q are connected to the coater/developer RD through a common conveyer system. In this configuration, after the processing terminates in the processing chamber P10, a wafer is conveyed to the tester Q through the conveyer system. The tester Q is provided with a plurality of types of tests such as an alignment test, a focus test, and a macro test, by way of example, thereby making it possible to improve the quality of the tests. Also, when an increased number of tests should be conducted, wafers can be temporarily stored in the buffer region B provided prior to the tester Q, so that the processing can be smoothly advanced substantially at a constant rhythm without largely disturbing the processing flow. It is important that the processing is advanced at constant time intervals maintained in the lithography step. This is because the degree of chemical reactions in the resist film varies depending on a processing time. In other words, when each wafer is processed for a constant time period, variations in the resist film can be made identical in each wafer, so that products of the same quality can be manufactured.

The aforementioned alignment test and focus test are conducted for determining pass/fail for a wafer by testing an alignment state and a focus state between patterns between layers on a wafer. The macro test in turn is conducted for determining pass/fail for a wafer in terms of a variety of defects such as defocus, uneven coating, and the like by irradiating a wafer with light from a linear light source, photographing the reflected light with a camera, and detecting a regular reflection figure and a diffraction figure through two scanning operations.

The two systems described herein may be combined, or a portion of elements in the second system may be added to the first system. The following description is made on insufficient aspects of the first system, and on elements and advantages of the second system.

According to an investigation on the causes of regeneration made by the inventors, though a mere example, 1.5% of regeneration resulted from the alignment accuracy; 0.8% was detected by a visual inspection of the development due to sporadic failures in the coater/developer and the aligner; and 0.08% resulted from dimensional failures detected by the length measuring SEM. While the values could vary depending on the operation, a required accuracy for a particular product, maturity of the process, and the stability of the apparatus, the dimensions tend to be relatively stable when the stability of the apparatus is ensured; the alignment accuracy is most instable and therefore a test is essential therefor; and sporadic failures, though occurring due to a variety of causes, can often be detected by a relatively rough appearance test. For these items, the tester Q requires a dimension measuring apparatus, an alignment accuracy measuring apparatus, and a macro tester. The QC integration is desired to consistently conduct a plurality of tests in consideration of the aforementioned causes as factors associated with the regeneration in this manner. While the priority can be given from the regeneration occurring percentages for the causes, the expandability is desired. In the first system, since the tester Q is carried on the chassis of the coater/developer RD, the first system encounters difficulties in providing the expandability. On the other hand, in the second system, a plurality of such test-related apparatuses can be integrated by expanding a common conveyer system. The advantage of integrating a plurality of test-related apparatuses is particularly effective for automatically determining the regeneration as is the case with the present invention.

This is because, though the determination on the regeneration requires not only the regeneration processing but also discrimination of causes for the regeneration, this intelligent requirement is difficult to understand only with data which simply indicates disalignment. When integrating the alignment accuracy measuring apparatus, micro tester and the function for testing focusing and the amount of exposure through an optical dimension measurement as described in this embodiment, a novel function suitable for the automated in-situ regeneration technology according to the present invention can be realized by controlling the testing functions in an actively related manner, for example, by photographing defects detected by the macro tester using an observation system of the alignment accuracy measuring apparatus to record or sort the defects; evaluating an abnormal distribution of diffracted light detected by the macro test for the focus and the amount of exposure to derive the quantitative characteristics; measuring a distribution across an overall wafer when a defective alignment accuracy is sensed such that it can be collated with an abnormal distribution of interference light detected by the macro test; and the like.

In an interface with the coater/developer RD, a buffer function is provided to absorb varying tact time of these test-related apparatuses, so that the number of tests and items in a lot, for example, can be dynamically varied. This is required for implementing a function of enhancing a testing function for a particular wafer for identifying the causes for the regeneration, for example, in a test for predecessor wafers and in a detection of regeneration. Also, in the second system, as shown in FIG. 11, the conveying system of the tester Q and the cassette loader CL are disposed coplanar with the coater/developer RD. This enables not only the in-line consistent processing but also an off-line test for a wafer supplied from the cassette (for example, a wafer worked by an apparatus which does not have an in-line tester, for example, in a rough step). By doing so, the tester is shared by both in-line and off-line, thereby making it possible to prevent an increase in the number of test-related apparatuses in the in-line tests. In this embodiment, the buffer region B is provided for making a schedule such that an off-line sampling test using a small number of samples is broken into the in-line tests, so that the off-line test is conducted without delay, which is more effective as well for TAT. Also, the investment on the test-related apparatuses can be largely reduced by sharing the conveyer system, communications, database and the like of a plurality of test-related apparatuses. The investment reduction effect described herein is important in giving the actuality of producing effects by applying the present invention to an actual line. In addition, this QC integration system not only enables a reduction in the size of apparatuses and consistency but also provides a space effect as compared with technologies of installing them off-line, respectively. Also, as is apparent from the drawings, a dead space produced by installing the aligner EXP and the coater/developer RD in an in-line configuration is utilized in an effective manner.

Figure 12:
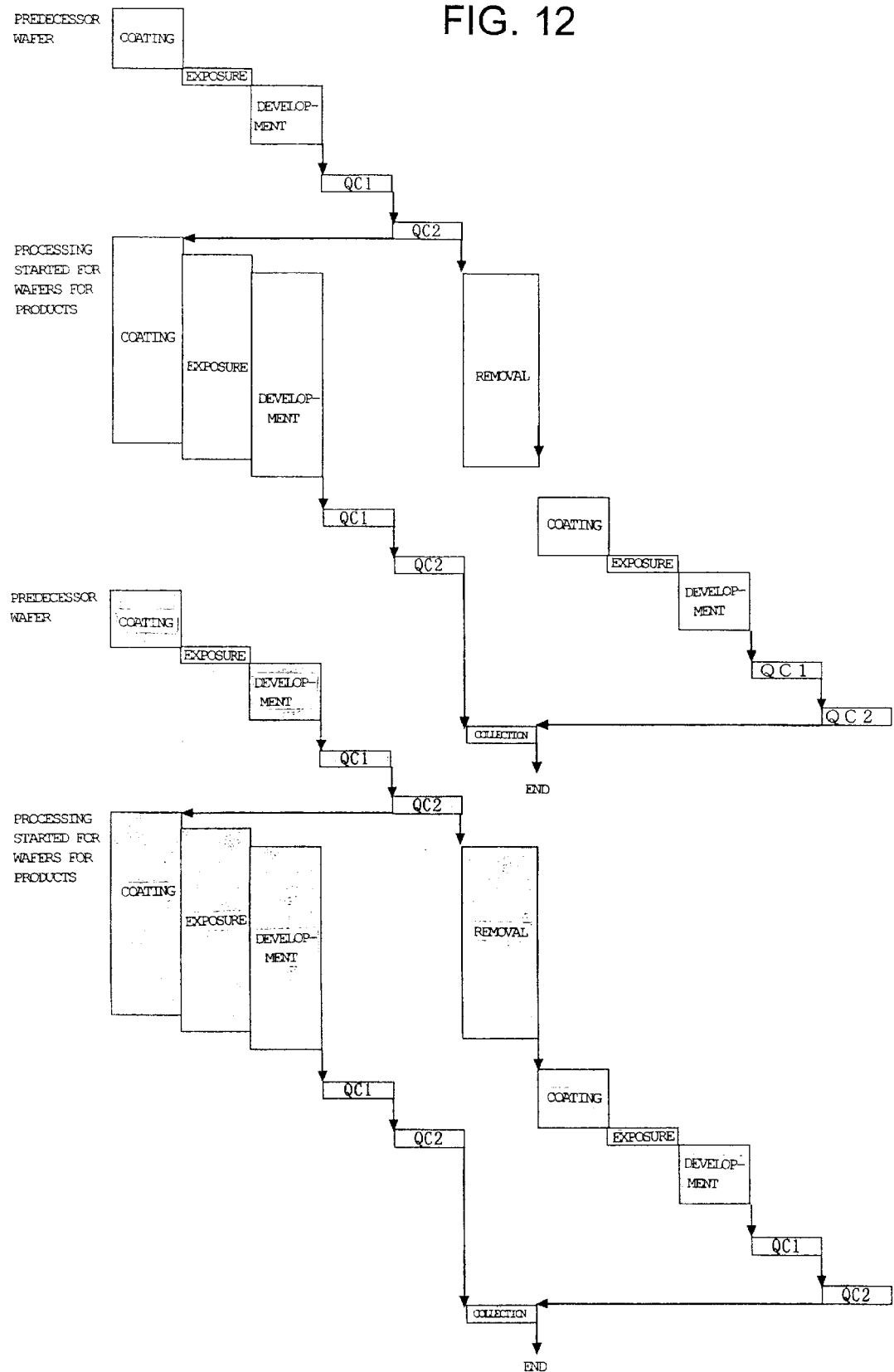
FIG. 12 is an explanatory diagram of a manufacturing time and the like when the predecessor and regeneration are performed in accordance with the technologies considered by the present inventors.
Figure 13:
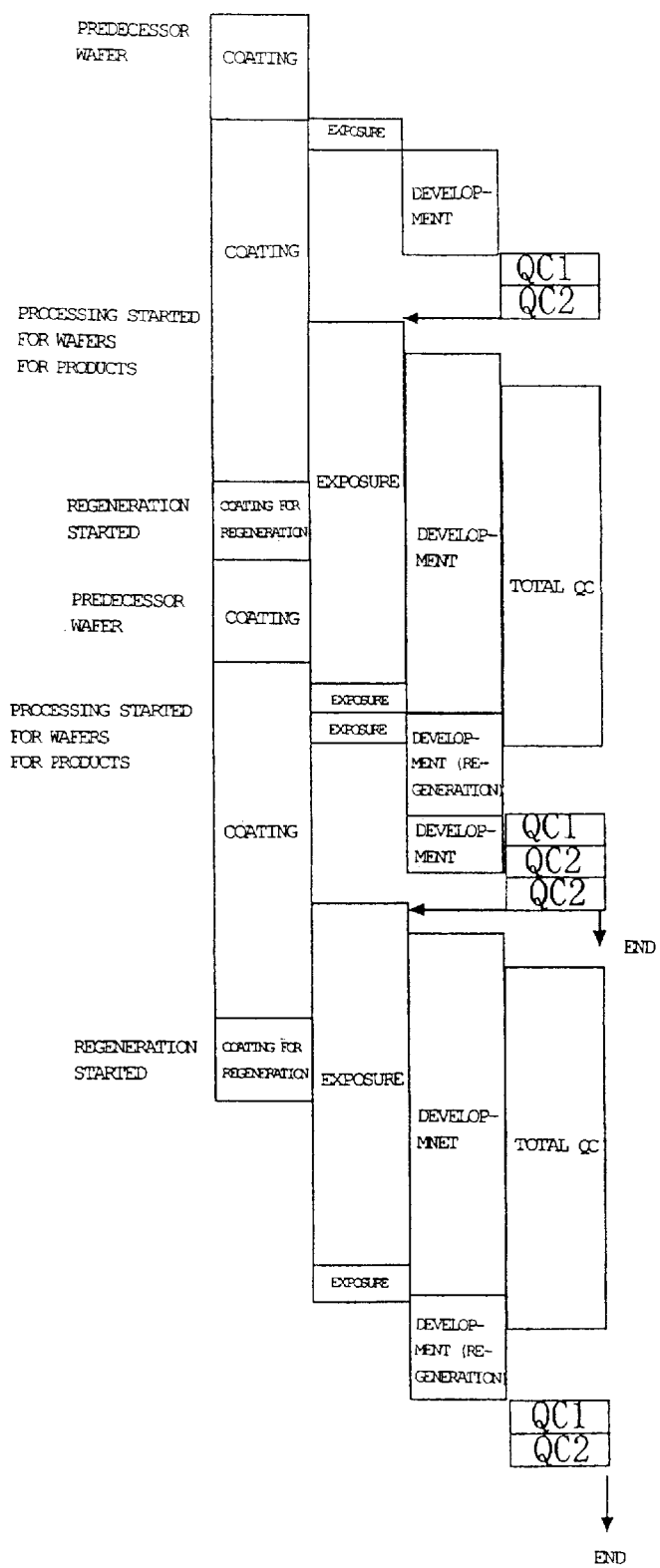
FIG. 13 is an explanatory diagram of a manufacturing time and the like when the predecessor and regeneration are performed in accordance with the method of manufacturing semiconductor integrated circuit devices in the flow of FIG. 1.

The employment of the in-situ regeneration processing and leaf flow control technology enables the so far performed predecessor processing to be implemented without sacrificing the apparatus efficiency or TAT. This is owing to the elimination of requirements for conveyance to the tester, division and agglomeration of lots, and regeneration of wafers determined as fail in the predecessor in a different apparatus, all of which would be required when the predecessor is performed. This will be described with reference to FIGS. 12 and 13. FIG. 12 is an explanatory diagram when the predecessor and regeneration are performed by the technologies studied by the inventors. FIG. 13 shows an embodiment of the present invention.

In FIGS. 12 and 13, the vertical direction represents a time axis, while the horizontal direction represents the order of processing, wherein the processing is advanced in parallel in a pipeline manner in a two-dimensional representation. The embodiment in FIG. 13 shows the aforementioned method which regenerates predecessor wafers after the main processing. FIG. 13 also shows the effect of parallel processing between lots when the lots are sequentially processed. As is apparent from a comparison of FIG. 12 with FIG. 13, the processing time in the vertical direction is largely reduced. Also, since the processing in the horizontal direction is reduced in complexity, it can be seen that a scheduling load is reduced in an automated line, thus contributing to a stable flow over the entire line.

Figure 14:
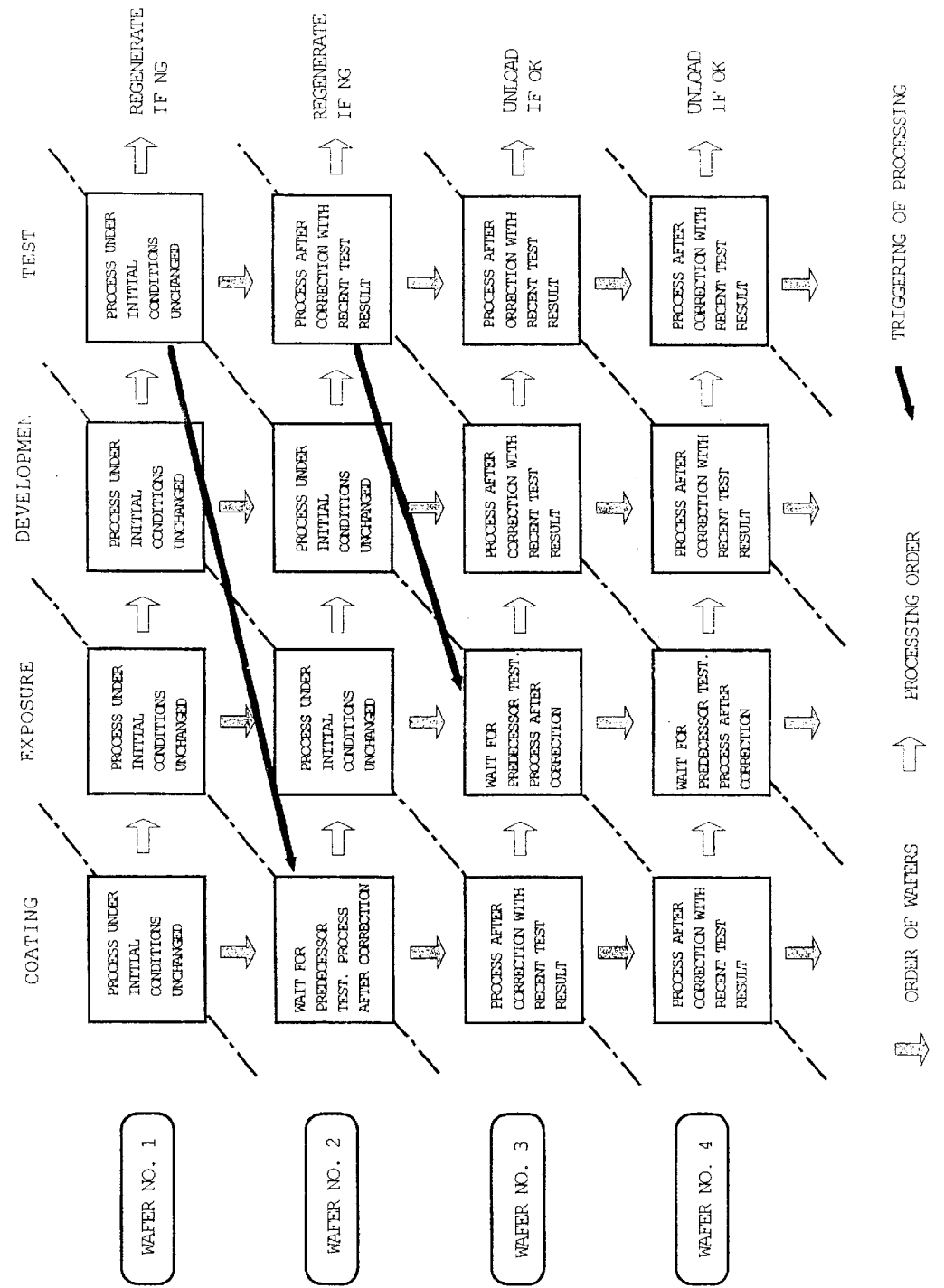
FIG. 14 is an explanatory diagram of the predecessor processing for a plurality of items in a method of manufacturing semiconductor integrated circuit devices according to another embodiment of the present invention.

Next, since such loss-free predecessor processing is enabled, a plurality of items of predecessor processing, which has not been so far implemented, is enabled. One implementation of this is shown in FIG. 14. In FIG. 14, first, after predecessor processing is performed for the coating performance, predecessor processing is performed for an aligner using the result of an alignment test for two predecessor wafers including that wafer. The processing sectioned by oblique lines is performed substantially simultaneously. Since a waste waiting time as before can be suppressed, although an individual wait may occur, multiple predecessor processing, which has not been so far implemented, can be achieved, thereby indicating that works can be efficiently performed for products without past records that would particularly require the predecessor. This is believed to be particularly effective in a flexible production.

Figure 15:
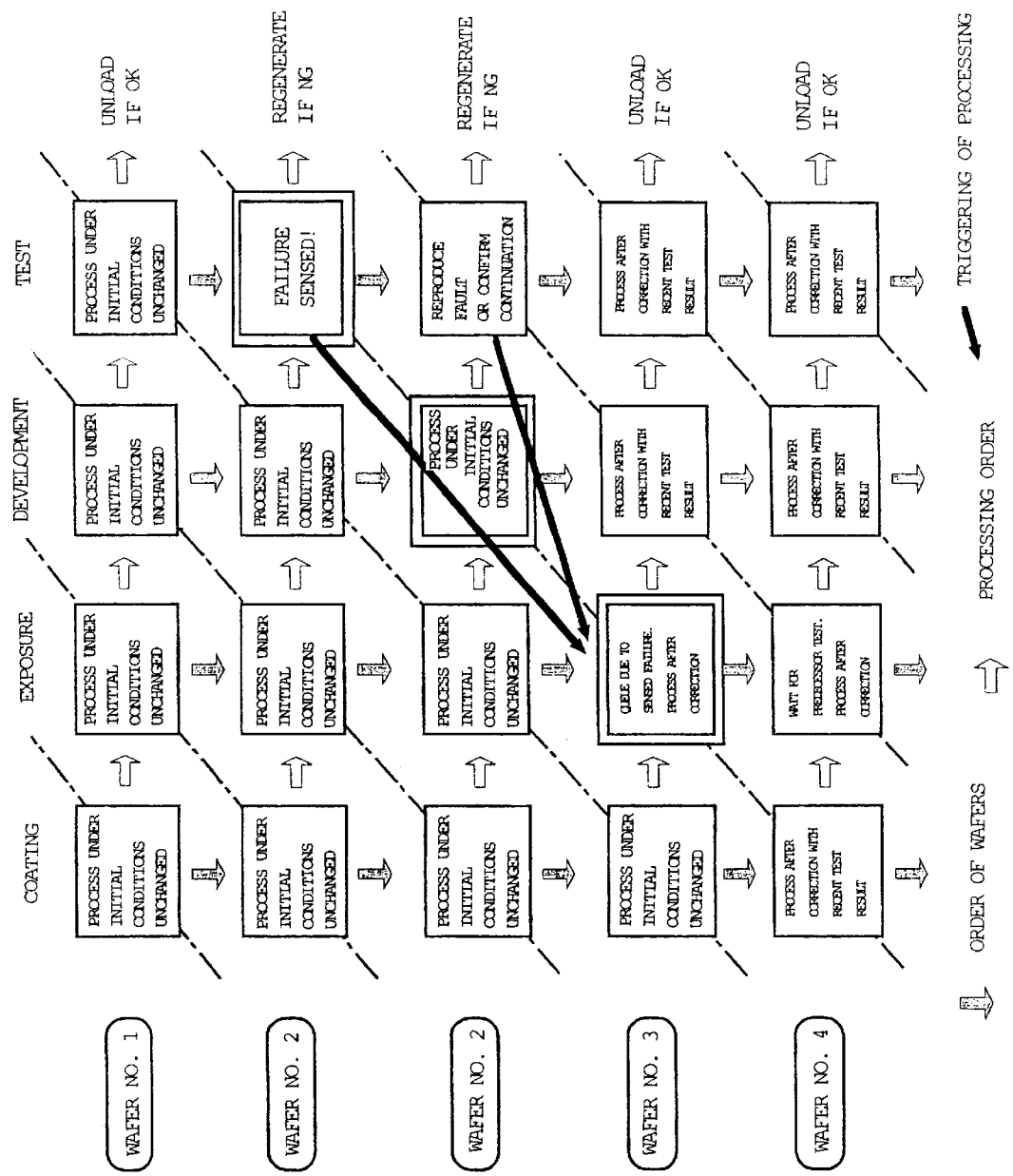
FIG. 15 is an explanatory diagram of another exemplary application of in-situ regeneration and QC integration in a method of manufacturing semiconductor integrated circuit devices according to another embodiment of the present invention.

FIG. 15 shows an other exemplary application of the in-situ regeneration and QC integration according to the present invention, i.e., an embodiment of a control for failure detection during works. Here, when a failure is detected in course of works on a lot which has been normally processed, it cannot be determined whether the result is caused by a change in the state of the process or whether the result indicates an exceptional discrete value unless examining the result of several subsequent wafers. However, when the lithography step has been started in an in-line configuration, several wafers have already been processed until the result of test is available for determination, so that wafers to be regenerated can be increased if the failure continues. On the other hand, in this embodiment, when a failure is detected, for example, in the result of exposure in an aligner, the processing of the aligner is temporarily stopped, and wafers are waited until the result of a test on previously processed several wafers is available. If it is determined from the result of the test that the failure indicates a temporary discrete value and therefore the conditions need not be changed, the processing is resumed as it is. If a correction for a change in the condition is found, it is fed back before the processing is resumed. The production efficiency is improved by thus minimizing the influence of the measures to the failure and in-situ regenerating the wafer determined as fail.

The two embodiments described in connection with FIGS. 14 and 15 assume nonstandard wafers which are determined to be subjected to the regeneration. Such a leaf quality control can be used in combination with algorithms for a general statistical quality control, a feedback control called Run to Run Controle, and the like, and can be implemented even under a condition that a wafer falls within the criteria and does not require the regeneration. The recent miniaturized LSI manufacturing process tends to provide improved yield rate and characteristics as the accuracy is higher, because a sufficient machining margin is not ensured. Therefore, in some cases, it is worth more severely screening wafers even if they satisfy the criteria. Generally, such a leaf control is not employed in many cases due to a trade-off that the production efficiency is largely hindered. Also, the described embodiment improves the reliability of the quality control by an active operation, which is not generally performed, involving controlling the flow while monitoring, and monitoring the result. Specifically, for corrections and control which cannot be employed unless the apparatus is once stopped for making an investigation and a high reliability can be assumed for the result of monitoring in order to avoid a loss due to the regeneration, the in-situ regeneration is relied on to allow measures to be taken in an indefinite situation. It is therefore contemplated that this technology is important for enhancing a non-stop operation in a completely automated line.

Next, FIGS. 16 to 19 show an exemplary application based on the present invention so far described, which is applied to tests for apparatuses in an automated line. Apparatuses for use in a lithography line are highly accurately systematized in large scale, so that good conditions must be maintained for a large number of factors for keeping a consistent quality. The compatibility of the factors between the apparatuses also affects the conditions. The accuracy to be managed for such apparatuses cannot be ensured only by an individual self-monitoring function provided in each of the apparatuses, so that the accuracy is checked by actually processing a wafer and measuring the result. In this case, for an aligner, for example, dedicated performance evaluation reticles having a variety of test patterns created by the maker or user are used to select or set an operating method or an evaluation pattern in accordance with a factor under evaluation. Then, a wafer is processed to collect data by a measuring apparatus, and the data is evaluated by a calculating method in accordance with the factor as well.

In this manner, a large number of wafers for testing are required for the lithography line because of the importance attached to the checking method for actually processing a wafer and measuring the result of the processing. The wafer is regenerated and repeatedly used after the test. Particularly, there are a large number of test items which require a reference wafer that is formed with a pattern used for reference to the accuracy on an underlying layer. In this case, since the accuracy is different for each wafer, each wafer must be regenerated for each apparatus. In the technologies studied by the inventors, such regeneration processing requires an excessive time, and cannot be scheduled because it is extra processing for the production, so that associated apparatuses are checked on an irregular basis and separately, and therefore resulting in insufficient management therefor. If the apparatuses are insufficiently managed, the accuracy at the time products are manufactured depends on a difference among the apparatuses, leading to an instable product accuracy, a resulting increase in the need for the predecessor processing, an increased frequency of regeneration, and significantly reduced production efficiency, needless to say.

Figure 16A:
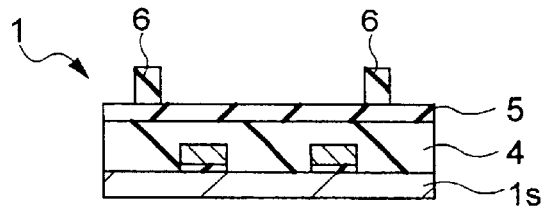
FIG. 16A is an explanatory diagram of the processing involved in reproducing a reference semiconductor wafer in-situ to form repetitive patterns for testing in a method of manufacturing semiconductor integrated circuit devices according to another embodiment of the present invention.
Figure 16B:
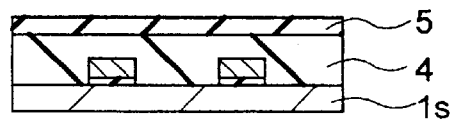
FIG. 16B is an explanatory diagram of the processing involved in reproducing a reference semiconductor wafer in-situ to form repetitive patterns for testing in a method of manufacturing semiconductor integrated circuit devices according to another embodiment of the present invention.
Figure 16C:
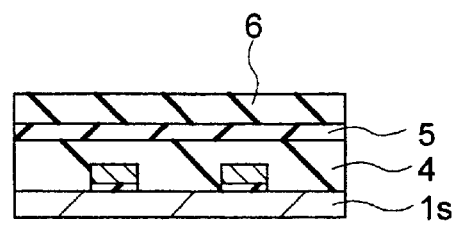
FIG. 16C is an explanatory diagram of the processing involved in reproducing a reference semiconductor wafer in-situ to form repetitive patterns for testing in a method of manufacturing semiconductor integrated circuit devices according to another embodiment of the present invention.
Figure 16D:
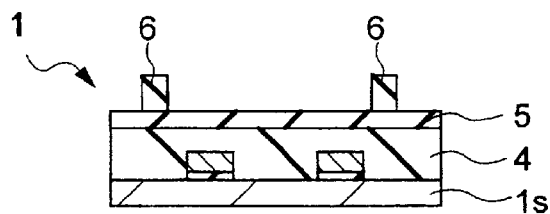
FIG. 16D is an explanatory diagram of the processing involved in reproducing a reference semiconductor wafer in-situ to form repetitive patterns for testing in a method of manufacturing semiconductor integrated circuit devices according to another embodiment of the present invention.

The following description focuses on an example in which the present invention is applied to such apparatus management and apparatus checking. FIG. 16 shows that the aforementioned reference wafer 1 is in-situ regenerated and repeatedly formed with a pattern for testing. As a reference wafer 1 having a step, a wafer 1 coated with an anti-reflection film 5 on a main surface thereof is used, and a patterned resist film 6 on the anti-reflection film 5 is repeatedly removed and regenerated (formed with a pattern). Specifically, a pattern on the resist film 6 shown in FIG. 16A is removed by thinner as shown in FIG. 16B, and a resist film 6 is again coated on the main surface of the reference wafer 1 as shown in FIG. 16C, and a test pattern is formed on the resist film 6 on the main surface of the reference wafer 1 by exposure processing as shown in FIG. 16D.

A variety of tests are conducted for a semiconductor integrated circuit device, for example, a test using a mirror wafer which has a mirror-polished main surface, a test for making evaluations related to the influence of a step which is exposed for the test, a test which involves coating only the resist film 6 on the reference wafer for the in-situ regeneration without the need for the anti-reflection film 5. While this embodiment is not limited to a test which uses the anti-reflection film 5, the use of the anti-reflection film 5 can prevent the reproductivity from deteriorating due to the film thickness uniformity of the resist film 6, which is coated again for every regeneration, affected by the underlying step, so that it can be effective for a test related to the alignment accuracy for an aligner, by way of example.

FIG. 17 shows an embodiment in which a variety of wafers 1 are collectively stored in a single cassette in order to perform each of checks or QC using a variety of wafers 1, and the aforementioned leaf flow control and QC integration (here, alignment accuracy, macro, focus, exposure amount) are used to conduct a total check. The check terminates at the time the processing for one cassette is completed. In this embodiment, while a single test is conducted for each wafer 1, a plurality of checking patterns for a plurality of factors may be inserted on the same wafer 1 for composition, or the aforementioned sequential processing control may be used to control a stage accuracy for an aligner with a wafer 1 which has undergone, for example, QC for a film thickness uniformity.

Figure 18:
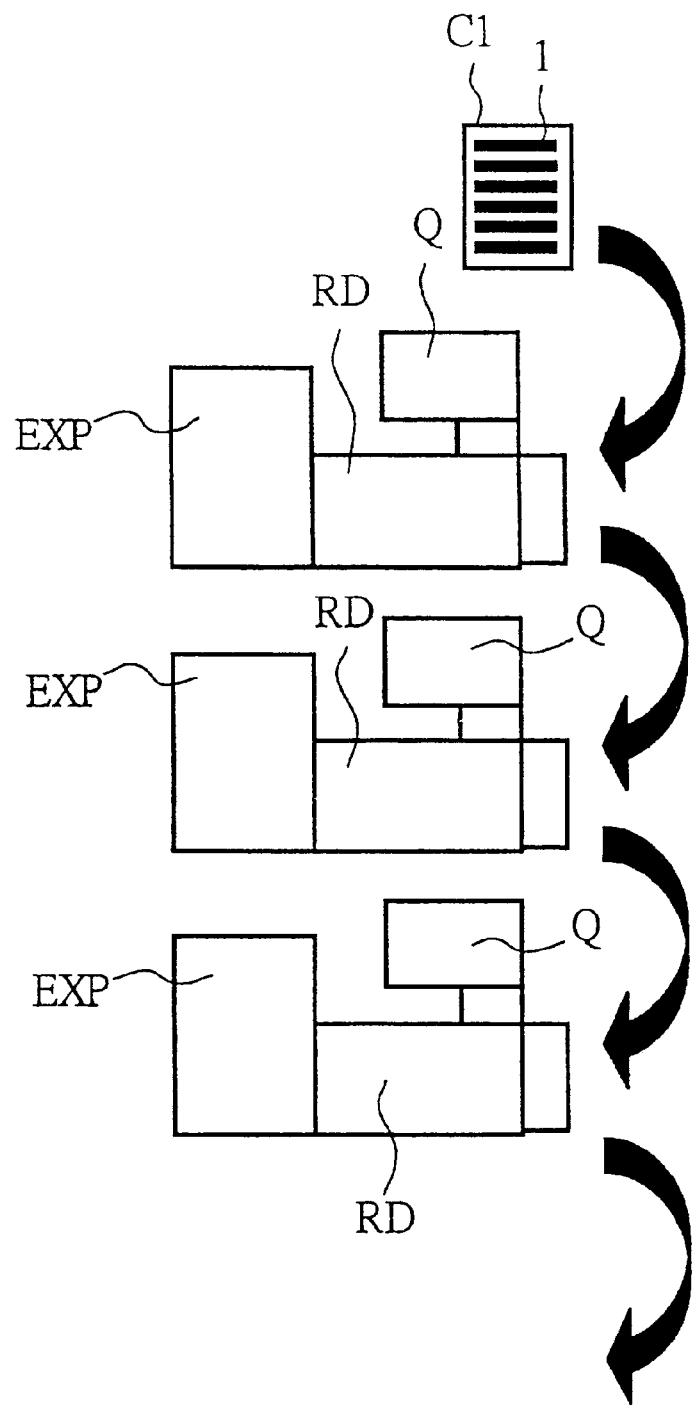
FIG. 18 is an explanatory diagram of the processing involved in conducting a total test for a plurality of semiconductor wafers in a method of manufacturing semiconductor integrated circuit devices according to another embodiment of the present invention.

FIG. 18 shows a method of performing a plurality of QC with the single cassette C1, wherein the in-situ regeneration is performed to conduct a similar total check on the same wafer 1 in the same cassette 1 over a lithography apparatus without the need for conveying the cassette C1 to the regeneration processing apparatus. This checking operation can be controlled to be executed while the cassette 1 of products is continuously introduced into the processing, as if they were a cassette for a single product. For this reason, there is no need for measures such as strategically stopping the introduction of products, and the like. Also, a pipeline parallel operation can also be achieved with the preceding and subsequent cassettes C1 for products if appropriately considering the order of the checking operation.

Figure 19:
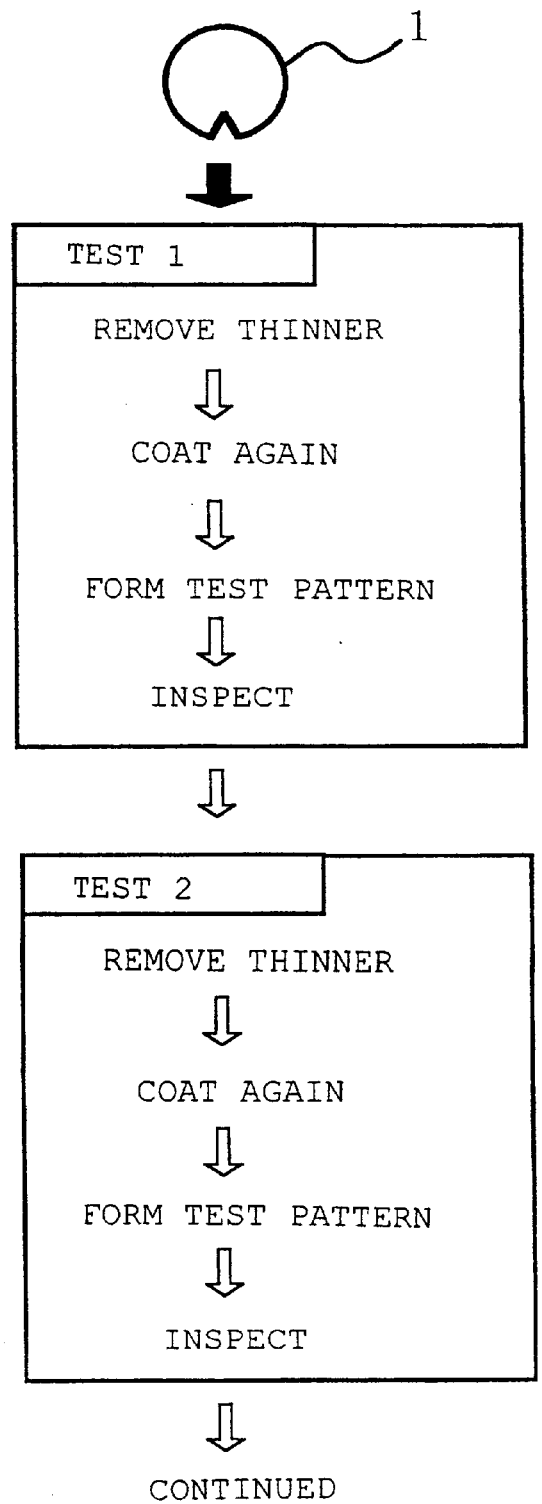
FIG. 19 is an explanatory diagram of the processing involved in repeatedly reproducing the same semiconductor wafer in-situ with a single apparatus for testing in a method of manufacturing semiconductor integrated circuit devices according to another embodiment of the present invention.

FIG. 19 shows that the same wafer 1 (single reference wafer) is repeatedly in-situ regenerated for testing with a single apparatus. Specifically, after performing in a test 1 a sequence of processing which involves removing a resist film on a main surface of a wafer with thinner, coating again a resist film, forming a test pattern through exposure, and a first inspection, a sequence of processing is performed in a test 2 which involves removing again the resist film on the main surface of the wafer 1 with thinner, coating again a resist film, forming a test pattern through exposure, and a second inspection. In this manner, the in-situ regeneration and tests are repeatedly performed. In combination with this method, when test items are changed depending on apparatus conditions, the need is reduced for preparing the wafers 1 and replacing the wafers 1 in the cassette, thereby leading to an improved flexibility for the engineering, particularly in an automated line. In addition, TAT can be reduced even with a high regeneration proportion.

Automated lines often experience difficulties in such engineering and end up in inability to operate. The several embodiments described above can provide detailed checking without affecting a production line, though not directly related to the productivity of the production line, so that they accomplish a prominent advance in the manufacturing of semiconductor integrated circuit devices.

(Second Embodiment)

The first embodiment has described a systematic method which can minimize a loss due to the regeneration, relying on the QC integration and leaf in-line flow control, for removing a resist film with thinner, putting an eye on the selectivity to the anti-reflection film. However, the present invention is not limited to the removal of the resist film with thinner or the use of the anti-reflection film. As described above, since the removal of the resist film with thinner may be insufficient in some cases, the resist film may not be removed when a negative-type resist film is used, or due to a refractorization resulting from post-processing after the development shown in FIGS. 20 and 21.

Figure 20A:
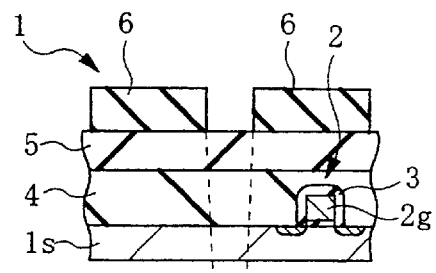
FIG. 20A is an explanatory diagram illustrating post-processing for heating a semiconductor wafer for reflow after development.
Figure 20B:
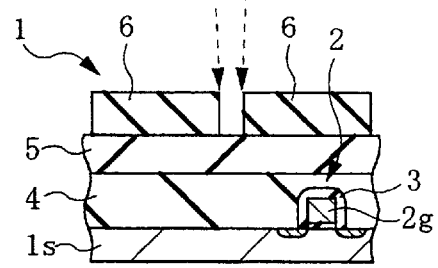
FIG. 20B is an explanatory diagram illustrating post-processing for heating a semiconductor wafer for reflow after development.
Figure 21:
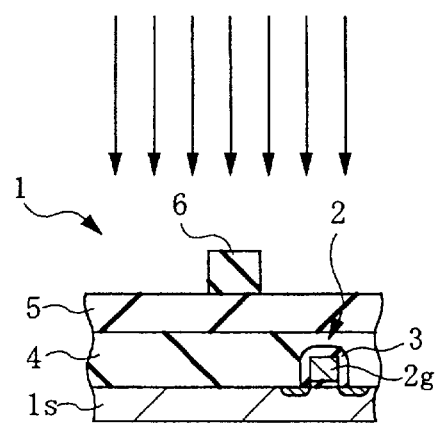
FIG. 21 is an explanatory diagram illustrating post-processing for curing a resist film by irradiating a semiconductor wafer after development with ultraviolet rays.

FIGS. 20A and 20B show post-processing which involves heating a wafer 1 after the development processing for reflow. Illustrated herein is the processing for reducing the diameter of a hole pattern (pattern of a hole such as a contact hole or a throughhole). FIG. 21 in turn shows post-processing for curing a resist film by irradiating a wafer 1 after the development processing with ultraviolet rays such as DUV light (for example, at wavelength of 193 nm). This is a technology for enhancing the etching resistance characteristic of the resist film.

The inability of the thinner to sufficiently remove the negative-type resist film can be solved by using a positive-type resist film. Since the positive-type resist film has a tendency of rapidly increasing the resolution, it is possible to employ the positive-type resist films for all lithography steps in a process of manufacturing semiconductor integrated circuits.

Figure 22:
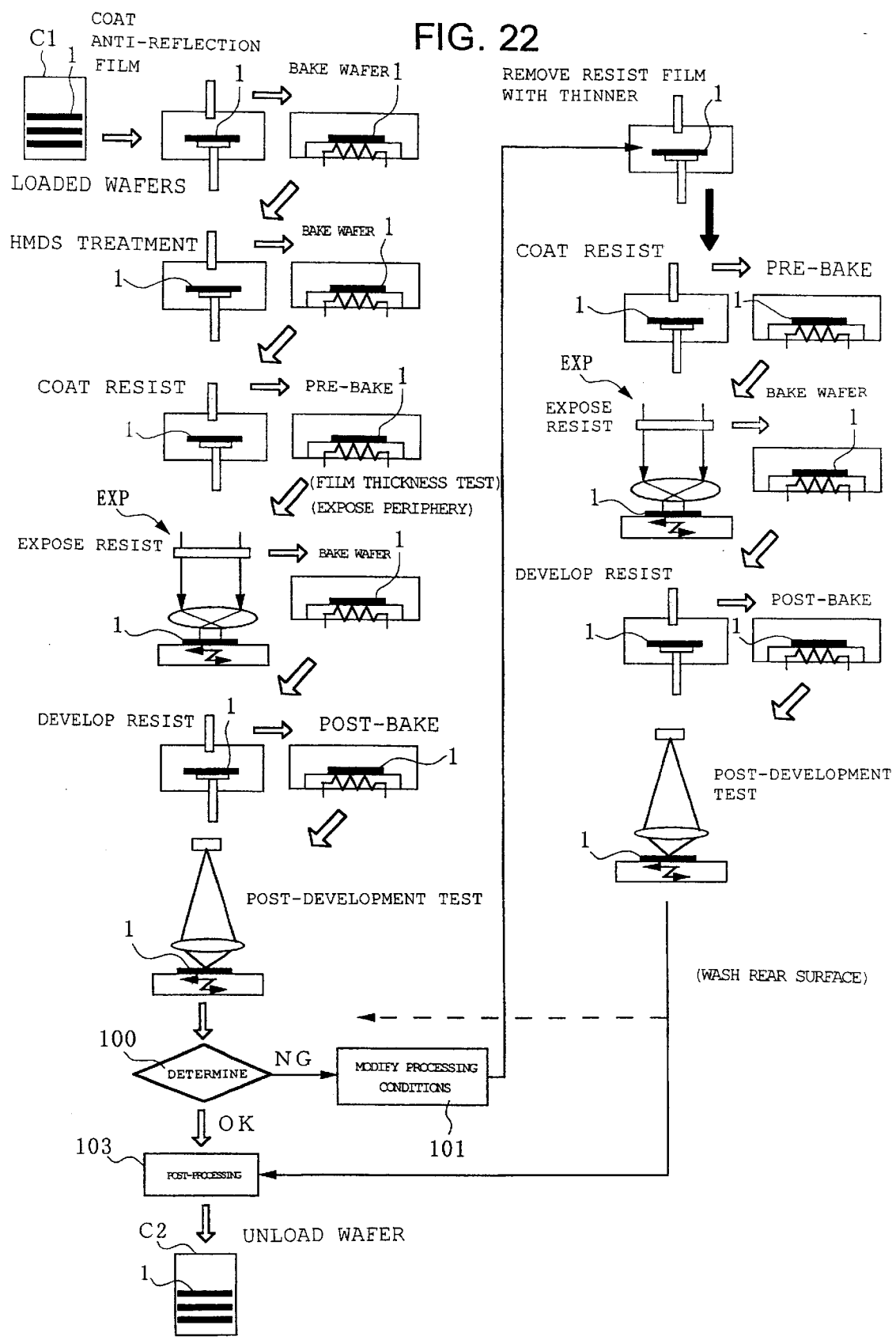
FIG. 22 is an explanatory diagram of an exemplary flow which requires a process of performing post-processing for refractorizing a resist film in a method of manufacturing semiconductor integrated circuit devices according to another embodiment of the present invention.
Figure 23A:
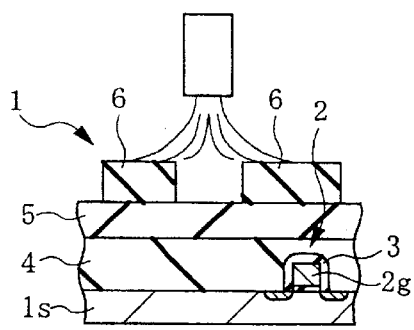
FIG. 23A is a cross-sectional view showing a main portion of a semiconductor wafer in a process of manufacturing semiconductor integrated circuit devices according to another embodiment of the present invention.
Figure 23E:
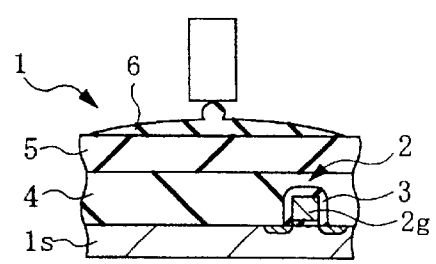
FIG. 23E is a cross-sectional view showing a main portion of a semiconductor wafer in a process of manufacturing semiconductor integrated circuit devices according to another embodiment of the present invention.
Figure 23B:
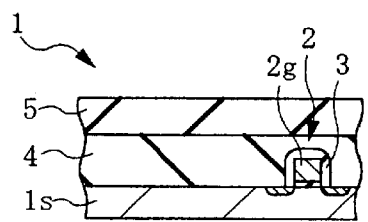
FIG. 23B is a cross-sectional view showing a main portion of a semiconductor wafer in a process of manufacturing semiconductor integrated circuit devices according to another embodiment of the present invention.
Figure 23F:
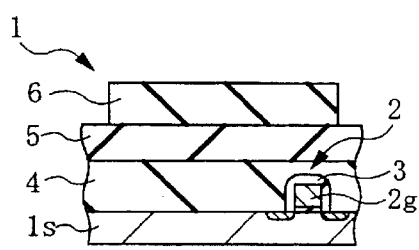
FIG. 23F is a cross-sectional view showing a main portion of a semiconductor wafer in a process of manufacturing semiconductor integrated circuit devices according to another embodiment of the present invention.
Figure 23C:
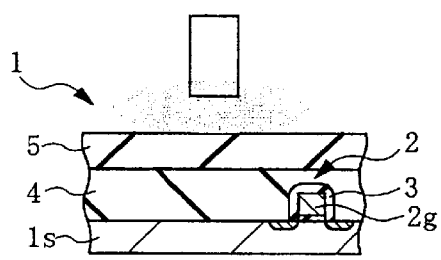
FIG. 23C is a cross-sectional view showing a main portion of a semiconductor wafer in a process of manufacturing semiconductor integrated circuit devices according to another embodiment of the present invention.
Figure 23D:
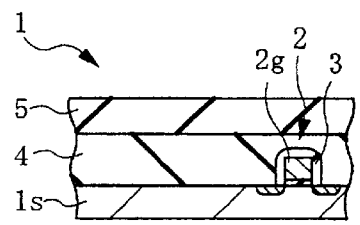
FIG. 23D is a cross-sectional view showing a main portion of a semiconductor wafer in a process of manufacturing semiconductor integrated circuit devices according to another embodiment of the present invention.

In addition, the refractorized resist film resulting from the post-processing can also be solved by the thinner-based resist removing technique, for example, in the following-manner, FIG. 22 shows an example which requires a process that involves post-processing which makes the resist film refractory in this embodiment. For the post-processing, this embodiment involves, as shown in FIG. 22, conducting an inspection immediately after development, regenerating nonstandard wafers after the development to ensure the quality of each wafer (after the completion of the regeneration processing), and performing the post-processing (step 103) for refractorizing the resist film for purposes of ensuring the quality. When the resist film refractorization processing is integrated, generally, a development test is often conducted after the post-processing. However, the inventors found for the first time during an investigation on the presently proposed technology that essentially, the post-processing is desirably performed after ensuring the quality by the regeneration processing, if required, after the development test is conducted, if there is no conveyance loss.

Since the present invention is highly probably required in the processing for refractorizing the resist film out of flows that have post-processing, the foregoing embodiment has been described in relation to the refractorization processing. However, the post-processing is not limited to the refractorization processing. For example, there is known a technology for reducing a hole by utilizing components remaining on a patterned resist film after the development such as acid, and coating another chemical after the development to react it with the remaining acid. Likewise, in such processing, the consistent execution of the post-processing on a coater/developer, after ensuring the quality, can improve the quality as compared with testing out of the coater, by way of example, because chemical reactions associated with the processing is sensitive to the temporal log.

(Third Embodiment)

The foregoing first and second embodiments have described the processing unit for coating a resist film which is provided with a nozzle for supplying thinner for removing the resist film. However, the underlying surface, not coated with an anti-reflection film, is likely to lose the effect of HMDS. Even when the anti-reflection film is coated, the effect of the HMDS treatment on the surface of the anti-reflection film is likely to deteriorate depending on the property of the resist film or a heat treatment, or when it is left for a long term with a resist film, as is the case when the apparatus is checked by repeatedly regenerating a particular wafer, as described above as an exemplary application of the present invention.

In this case, the HMDS treatment must be performed again on the surface of the anti-reflection film or the underlying surface. However, as shown in FIGS. 1 and 22, the HMDS treatment is positioned before the resist film coating (removing) step, so that if a wafer is passed to the resist film coating bowl for removing the resist film for regeneration, the wafer must be sent back to the previous step for the HMDS treatment after the resist film has been removed with thinner, possibly resulting in disturbance in the steps.

To solve this problem, in this embodiment, a resist film of a wafer to be regenerated is removed with thinner in the anti-reflection film coating bowl in order to perform the HMDS treatment after the removal of the resist film. Since the anti-reflection film coating step is previous to the HMDS treatment, a wafer to be regenerated is passed to the anti-reflection film coating bowl, where the resist film is removed, thereby making it possible to smoothly pass the wafer to the HMDS treatment step in continuation. Specifically, after the removal of the resist film in the coating bowl for coating the anti-reflection film on the main surface of the wafer, the HMDS treatment and coating of the resist film can be sequentially performed in a manner similar to the first processing, so that the processing can be carried out without largely disturbing the pipeline operation. For this purpose, the anti-reflection film coating bowl must be provided with a nozzle for supplying thinner, like the resist film coating bowl. The nozzle in the anti-reflection film coating bowl is not an excessive nozzle, but can be used to improve the coatability of the anti-reflection film, as is the case with the resist film.

FIG. 23 shows an example which uses the anti-reflection film that is formed in the processing according to the third embodiment. When the anti-reflection film is not used, this example is identical except for the lack of the first anti-reflection film coating. FIGS. 23A and 23B show steps of removing the resist film 6 with thinner, similar to the aforementioned first embodiment. Here, the resist film 6 is removed with thinner in the anti-reflection film coating bowl. In this case, assume that the surface modification effect of the anti-reflection film 5 on the main surface of the wafer 1 is lost. Then, as shown in FIG. 23C, the HMDS treatment is applied to the surface of the anti-reflection film 5 to modify the surface of the anti-reflection film 5. Subsequently, a resist film 6 is coated on the anti-reflection film 5 as shown in FIG. 23E after the wafer 1 is baked as shown in FIG. 23D. Then, as shown in FIG. 23F, pre-bake processing is performed.

In this manner, the processing can be controlled without disturbing the processing flow only by switching the location at which the wafer to be regenerated is passed within a sequence of operation flow performed in the pipeline operation, such as passing the wafer to be regenerated to the anti-reflection film coating bowl when the HMDS treatment is performed, and passing the wafer to be regenerated to the resist film coating bowl when the HMDS treatment is not required. This embodiment of the present invention also proposes the respective methods and a control for switching the methods in accordance with a log of wafers.

(Fourth Embodiment)

A fourth embodiment describes the case where an anti-reflection film is coated overlying a resist film. Likewise, in this case, the flow similar to those in the aforementioned first to third embodiments can be basically applied without affecting the pipeline processing.

Figure 24A:
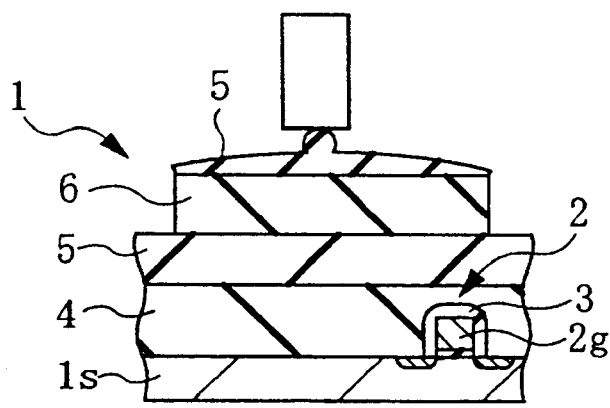
FIG. 24A is a cross-sectional view showing a main portion of a semiconductor wafer in a process of manufacturing semiconductor integrated circuit devices according to a still another embodiment of the present invention.
Figure 24B:
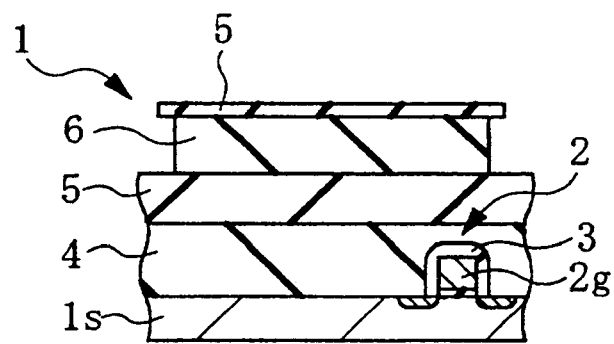
FIG. 24B is a cross-sectional view showing a main portion of a semiconductor wafer in a process of manufacturing semiconductor integrated circuit devices according to a still another embodiment of the present invention.

One example is described with reference to FIGS. 24 to 26. First, after passing through similar steps to those shown in FIGS. 2A to 2G, the anti-reflection film 5 is again coated on the resist film as shown in FIG. 24A, and the resulting wafer is baked as shown in FIG. 24B.

Figure 25A:
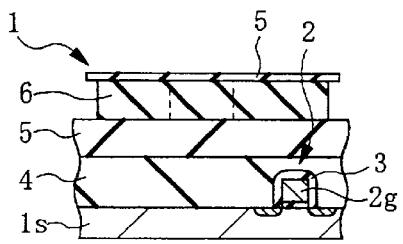
FIG. 25A is a cross-sectional view showing the main portion of the semiconductor wafer in a process of manufacturing semiconductor integrated circuit devices subsequent to FIG. 24.
Figure 25B:
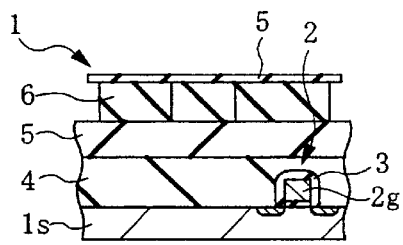
FIG. 25B is a cross-sectional view showing the main portion of the semiconductor wafer in a process of manufacturing semiconductor integrated circuit devices subsequent to FIG. 24.
Figure 25C:
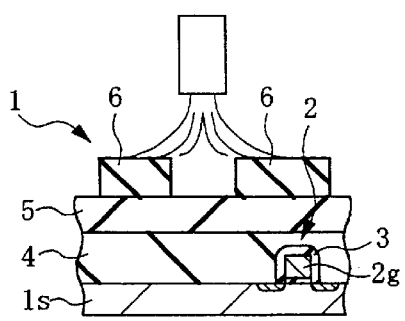
FIG. 25C is a cross-sectional view showing the main portion of the semiconductor wafer in a process of manufacturing semiconductor integrated circuit devices subsequent to FIG. 24.
Figure 25D:
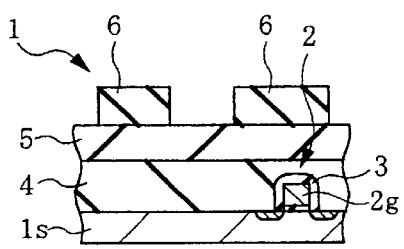
FIG. 25D is a cross-sectional view showing the main portion of the semiconductor wafer in a process of manufacturing semiconductor integrated circuit devices subsequent to FIG. 24.

Next, similarly to the first embodiment, after the wafer 1 is exposed as shown in FIG. 25A, the wafer 1 is baked as shown in FIG. 25B. Subsequently, as shown in FIG. 25C, the development processing is performed to remove the topmost anti-reflection film 5 and a predetermined portion of the resist film 6. Then, as shown in FIG. 25D, the post-bake processing is performed to form a pattern on the resist film 6.

Figure 26A:
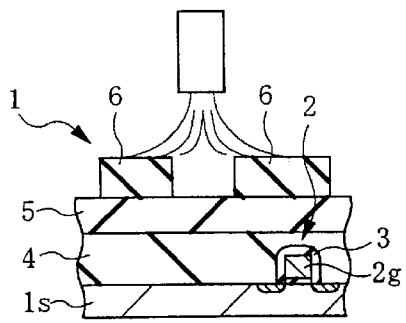
FIG. 26A is a cross-sectional view showing the main portion of the semiconductor wafer in a process of manufacturing semiconductor integrated circuit devices subsequent to FIG. 25.

Next, similarly to the first embodiment, a test after the development is conducted to determine pass/fail for the wafer 1 (pattern on the resist film 6), and the wafer 1 is passed to the regeneration processing if it is determined as failing to satisfy the criteria. In the regeneration processing, similarly to the first embodiment, the wafer 1 is sent to a processing unit for coating a resist film, and the resist film 6 on the wafer 1 is removed with thinner as shown in FIGS. 26A and 26B. Here, the modification effect on the surface of the underlying anti-reflection film 5 still remains. Thus, as shown in FIG. 26C, a resist film 6 is again coated on the anti-reflection film 5 on the main surface of the wafer 1. The steps shown in FIGS. 26A to 26C are performed in the same processing unit as is the case with the first embodiment.

Figure 26E:
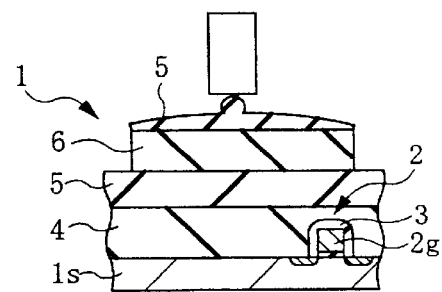
FIG. 26E is a cross-sectional view showing the main portion of the semiconductor wafer in a process of manufacturing semiconductor integrated circuit devices subsequent to FIG. 25.
Figure 26B:
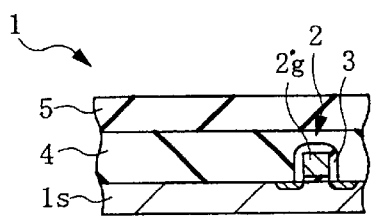
FIG. 26B is a cross-sectional view showing the main portion of the semiconductor wafer in a process of manufacturing semiconductor integrated circuit devices subsequent to FIG. 25.
Figure 26F:
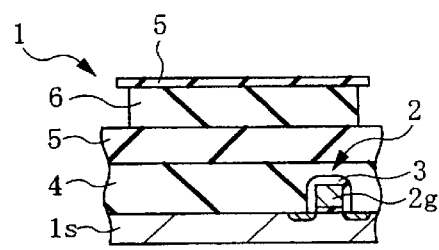
FIG. 26F is a cross-sectional view showing the main portion of the semiconductor wafer in a process of manufacturing semiconductor integrated circuit devices subsequent to FIG. 25.
Figure 26C:
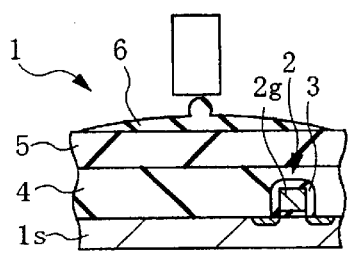
FIG. 26C is a cross-sectional view showing the main portion of the semiconductor wafer in a process of manufacturing semiconductor integrated circuit devices subsequent to FIG. 25.
Figure 26D:
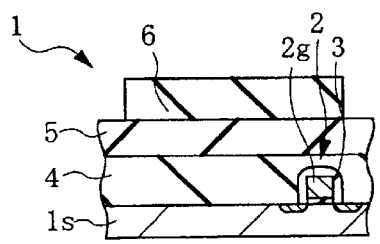
FIG. 26D is across-sectional view showing the main portion of the semiconductor wafer in a process of manufacturing semiconductor integrated circuit devices subsequent to FIG. 25.

Next, after the pre-bake processing is performed as shown in FIG. 26D, an anti-reflection film 5 is coated on the resist film 6 as shown in FIG. 26E, and the wafer 1 is baked as shown in FIG. 26F.

In this manner, a sequence of operations involving the coating of the resist film, exposure, development, test and regeneration can be carried out without disturbing the in-line pipeline operation in this embodiment as well.

While the invention made by the inventors has been specifically described in connection with specific embodiments thereof, it goes without saying that the present invention is not limited to the foregoing embodiments, but may be modified in a variety of ways without departing from the spirit and scope of the invention.

For example, while the foregoing embodiments have been described for a semiconductor substrate formed with an MIS·FET, the present invention is not limited to MIS·FET, but may be modified in a variety of ways. For example, the present invention can be applied as well to a semiconductor substrate which is formed with another element such as a bipolar transistor, a diode, a capacitor, a resistor and the like, byway of example, or a collection of a plurality of these elements.

While the foregoing description has been mainly made on methods of manufacturing semiconductor integrated circuit devices, which belong to the field of utilization that is the background of the invention, to which the invention made by the inventors is applied, the present invention is not limited to those methods, but can be applied to the technology which requires the lithography step for transferring a predetermined pattern onto a predetermined substrate, for example, a method of manufacturing liquid crystal substrates, a method of manufacturing a micromachine, and so on.

The benefits provided by represented aspects of the present invention disclosed in this application are outlined in the following.

(1) According to the present invention, the method of manufacturing semiconductor integrated circuit devices has, for each semiconductor wafer, a step of depositing a photosensitive organic film, a step of performing exposure processing, a step of performing development processing, a step of conducting a test, a consistent processing step for removing the photosensitive organic film from a semiconductor wafer which is determined as nonstandard by the test, and sending the semiconductor wafer back to the step of depositing the photosensitive organic film to regenerate the semiconductor wafer, wherein in a system for performing the consistent processing, the other processing is automatically performed in parallel for the remaining semiconductor wafers in a plurality of semiconductor wafers during the regeneration processing for the semiconductor wafer, thereby making it possible to improve the efficiency of a lithography step in a process of manufacturing semiconductor integrated circuit devices.

(2) According to the present invention, the method of manufacturing semiconductor integrated circuit devices has, for each semiconductor wafer, a step of depositing a photosensitive organic film, a step of performing exposure processing, a step of performing development processing, a step of conducting a test, a consistent processing step for removing the photosensitive organic film from a semiconductor wafer which is determined as nonstandard by the test, and sending the semiconductor wafer back to the step of depositing the photosensitive organic film to regenerate the semiconductor wafer, wherein in a system for performing the consistent processing, the other processing is automatically performed in parallel for the remaining semiconductor wafers in a plurality of semiconductor wafers during the regeneration processing for the semiconductor wafer, thereby making it possible to reduce a time period required for a lithography step in a process of manufacturing semiconductor integrated circuit devices.

(3) According to the present invention, the method of manufacturing semiconductor integrated circuit devices has, for each semiconductor wafer, a step of depositing a photosensitive organic film, a step of performing exposure processing, a step of performing development processing, a step of conducting a test, a consistent processing step for removing the photosensitive organic film from a semiconductor wafer which is determined as nonstandard by the test, and sending the semiconductor wafer back to the step of depositing the photosensitive organic film to regenerate the semiconductor wafer, wherein in a system for performing the consistent processing, the other processing is automatically performed in parallel for the remaining semiconductor wafers in a plurality of semiconductor wafers during the regeneration processing for the semiconductor wafer, thereby making it possible to improve the quality of semiconductor integrated circuits.

What is claimed is:

1. A method of manufacturing semiconductor integrated circuit devices comprising relative to each semiconductor wafer of a group of plural semiconductor wafers:

(a) a step of depositing a photosensitive organic film on a main surface of said semiconductor wafer;

(b) a step of performing exposure processing on said semiconductor wafer;

(c) a step of performing development processing on said semiconductor wafer;

(d) a step of testing the semiconductor wafer after said development processing;

(e) a step of removing the photosensitive organic film on said semiconductor wafer when said semiconductor wafer is determined as nonstandard by a result of said test; and (f) a consistent processing step for performing a processing for removing said photosensitive organic film in a processing unit for depositing the photosensitive organic film, and thereby connecting the step of removing said photosensitive organic film to the step of depositing said photosensitive organic film and repeating the steps following after the step of depositing said photosensitive organic film to regenerate said semiconductor wafer, wherein in a system for performing said consistent processing, other processing is automatically performed in parallel for other semiconductor wafers among said group of plural semiconductor wafers during the regeneration processing of said semiconductor wafer determined as nonstandard.

2. The method of manufacturing semiconductor integrated circuit devices according to claim 1,
wherein an organic solvent is used at the time of removing said photosensitive organic film.

3. The method of manufacturing semiconductor integrated circuit devices according to claim 2,
wherein said organic solvent is thinner, and
wherein said regeneration processing step includes depositing said photosensitive organic film on the main surface of said semiconductor wafer while the thinner used for removing said photosensitive organic film is left on the main surface of said semiconductor wafer.

4. The method of manufacturing semiconductor integrated circuit devices according to claim 1,
wherein an underlying surface of said photosensitive organic film in said semiconductor wafer is flatten.

5. The method of manufacturing semiconductor integrated circuit devices according to claim 1,
wherein an anti-reflection film is deposited on the main surface of said semiconductor wafer in advance.

6. The method of manufacturing semiconductor integrated circuit devices according to claim 5,
wherein an underlying surface of said anti-reflection film is flatten in said semiconductor wafer.

7. The method of manufacturing semiconductor integrated circuit devices according to claim 1, further comprising a step of performing a dissolution resistance processing, after said semiconductor wafer is determined to satisfy criteria in said test, for a pattern of the photosensitive organic film formed on the semiconductor wafer corresponding to the criteria.

8. The method of manufacturing semiconductor integrated circuit devices according to claim 1,
wherein a semiconductor wafer determined as said nonstandard is made to wait in a buffer region, and said photosensitive organic film is coated on a main surface of a last semiconductor wafer among said group of plural semiconductor wafers, and thereafter, subsequently to the last semiconductor wafer, the semiconductor wafer determined as nonstandard in said buffer region is introduced into a processing unit for depositing said photosensitive organic film, and said regeneration processing is performed.

9. The method of manufacturing semiconductor integrated circuit devices according to claim 1,
wherein said semiconductor wafer determined as nonstandard is once returned to the cassette, and said photosensitive organic film is coated on a main surface of a last semiconductor wafer among said group of plural semiconductor wafers, and thereafter, subsequently to the last semiconductor wafer, the semiconductor wafer determined as nonstandard in said cassette is introduced into a processing unit for depositing said photosensitive organic film, and said regeneration processing is performed.

10. The method of manufacturing semiconductor integrated circuit devices according to claim 1,
wherein information obtained in said testing step is provided, as a processing condition for a semiconductor wafer subsequent thereto.

11. The method of manufacturing semiconductor integrated circuit devices according to claim 10,
wherein the semiconductor wafer subsequently thereto is once made to wait until information is obtained in said testing step, and the processing condition is corrected based on the information at the time of obtaining the information, and thereafter a processing of said waiting semiconductor wafer is resumed.

12. The method of manufacturing semiconductor integrated circuit devices comprising relative to each semiconductor wafer of a group of plural semiconductor wafers:
 (a) a step of depositing an anti-reflection film on a main surface of said semiconductor wafer;
 (b) a step of performing a processing for property-altering a surface of said anti-reflection film;
 (c) a step of depositing a photosensitive organic film on said anti-reflection film;
 (d) a step of performing exposure processing on said semiconductor wafer;
 (e) a step of performing development processing on said semiconductor wafer;
 (f) a step of testing the semiconductor wafer after said development processing;
 (g) a step of removing the photosensitive organic film on said semiconductor wafer when said semiconductor wafer is determined as nonstandard by a result of said test; and
 (h) a consistent processing step for performing a processing for removing said photosensitive organic film in a processing unit for depositing the photosensitive organic film, and thereby connecting the step of removing said photosensitive organic film to the step of depositing said photosensitive organic film and repeating the steps following after the step of depositing said photosensitive organic film to regenerate said semiconductor wafer,
wherein in a system for performing said consistent processing, other processing is automatically performed in parallel for other semiconductor wafers among said group of plural semiconductor wafers during the regeneration processing of said semiconductor wafer determined as nonstandard.

13. The method of manufacturing semiconductor integrated circuit devices according to claim 12,
wherein said photosensitive film is selectively removed by using an organic solvent at the time of removing said photosensitive organic film.

14. The method of manufacturing semiconductor integrated circuit devices according to claim 13,
wherein said organic solvent is thinner, and
wherein while the thinner used for removing said photosensitive organic film is left on said anti-reflection film at said regeneration processing, said photosensitive organic film is deposited on the anti-reflection film.

15. The method of manufacturing semiconductor integrated circuit devices according to claim 12,
wherein an underlying surface of said anti-reflection film is flattened in said semiconductor wafer.

16. The method of manufacturing semiconductor integrated circuits devices according to claim 12,
wherein an upper surface of said anti-reflection film is flattened in said semiconductor wafer.

17. The method of manufacturing semiconductor integrated circuit devices according to claim 16, wherein an underlying surface of said anti-reflection film is flattened in said semiconductor wafer.

18. The method of manufacturing semiconductor integrated circuit devices according to claim 12, wherein in the case of determining that a surface property-altering processing of said anti-reflection film is again required at said regeneration processing, said photosensitive organic film is removed in a processing unit for depositing said anti-reflection film, and thereafter the surface of said anti-reflection film is property-altered, and the steps subsequently thereto is repeated to select the consistent processing step for regenerating said semiconductor wafer.

19. The method of manufacturing semiconductor integrated circuit devices according to claim 12, wherein a semiconductor wafer determined as said nonstandard is made to wait in a buffer region, and said photosensitive organic film is coated on a main surface of a last semiconductor wafer among said group of plural semiconductor wafers, and thereafter, subsequently to the last semiconductor wafer, the semiconductor wafer determined as nonstandard in said buffer region is introduced into a processing unit for depositing said photosensitive organic film, and said regeneration processing is performed.

20. The method of manufacturing semiconductor integrated circuit devices according to claim 12, wherein said semiconductor wafer determined as nonstandard is once returned to the cassette, and said photosensitive organic film is coated on a main surface of a last semiconductor wafer among said group of plural semiconductor wafers, and thereafter, subsequently to the last semiconductor wafer, the semiconductor wafer determined as nonstandard in said cassette is introduced into a processing unit for depositing said photosensitive organic film, and said regeneration processing is performed.

21. The method of manufacturing semiconductor integrated circuit devices according to claim 12, wherein information obtained in said testing step is provided, as a processing condition for a semiconductor wafer subsequent thereto.

22. The method of manufacturing semiconductor integrated circuits according to claim 12, wherein the semiconductor wafer subsequently thereto is once made to wait until information is obtained in said testing step, and the processing condition is corrected based on the information at the time of obtaining the information, and thereafter a processing of said waiting semiconductor wafer is resumed.

23. A method of manufacturing semiconductor integrated circuit devices comprising relative to each semiconductor wafer of a group of plural semiconductor wafers:

(a) a step of depositing an anti-reflection film on a main surface of said semiconductor wafer;

(b) a step of performing a processing for property-altering a surface of said anti-reflection film;

(c) a step of depositing a photosensitive organic film on said anti-reflection film;

(d) a step of performing exposure processing on said semiconductor wafer;

(e) a step of performing development processing on said semiconductor wafer;

(f) a step of testing the semiconductor wafer after said development processing;

(g) a step of removing the photosensitive organic film on said semiconductor wafer when said semiconductor wafer is determined as nonstandard by a result of said test; and (h) a consistent processing step for performing a processing for removing said photosensitive organic film in a processing unit for depositing said anti-reflection film, and thereby removing said photosensitive organic film, and thereafter property-altering a surface of said anti-reflection film, and repeating the steps subsequently thereto to regenerate said semiconductor wafer, wherein in a system for performing said consistent processing, other processing is automatically performed in parallel for other semiconductor wafers among said group of plural semiconductor wafers during the regeneration processing of said semiconductor wafer determined as nonstandard.

24. A method of manufacturing a semiconductor integrated circuit device in which an apparatus system, which has an aligner and a coater/developer connected thereto, performs a consistent processing in a pipeline operation, wherein the method comprises the steps of:

connecting a tester to said coat/developer to synchronize the similar pipeline operation after a development processing, and thereby testing a semiconductor wafer one by one in sequence;

removing a photosensitive organic film formed on the semiconductor wafer in said coater/developer if a test result thereof determines the semiconductor wafer as nonstandard; and further coating a photosensitive organic film to perform exposing and developing processings based on the test result.

25. The method of manufacturing semiconductor integrated circuit devices according to claim 24, wherein after development of the photosensitive organic film on the semiconductor wafer, a test is performed and a regeneration processing is performed as occasion demands, and wherein, after the semiconductor wafer falls within criteria, a dissolution resistant processing of a pattern on said photosensitive organic film is performed.

26. The method of manufacturing semiconductor integrated circuit devices according to claim 24, wherein said step of removing said photosensitive organic film is performed by using an organic solvent inside said coater/developer.

27. The method of manufacturing semiconductor integrated circuit devices according to claim 26, wherein said semiconductor wafer is deposed by said photosensitive organic film after coating of an anti-reflection film over an underlying surface thereof;

wherein said anti-reflection film is not dissolved by said organic solvent, or said photosensitive organic film is selectively removed at the time of removing said photosensitive organic film if a solubility thereof is smaller than said photosensitive organic film.

28. The method of manufacturing semiconductor integrated circuit devices according to claim 26, wherein said step of removing the photosensitive organic film is performed by rotating said semiconductor wafer inside a processing unit for coating said photosensitive organic film.

29. The method of manufacturing semiconductor integrated circuit devices according to claim 28, wherein a semiconductor wafer to be regenerated waits in a buffer region, and said photosensitive organic film is removed from the semiconductor wafer to be regenerated subsequent to completion of coating of a photosensitive organic film on a last semiconductor wafer in a cassette, thereby maintaining an order in which the semiconductor wafers are processed.

30. The method of manufacturing semiconductor integrated circuit devices according to claim 29,
wherein a wafer is temporarily returned to the cassette under processing to provide a function of the buffer region without specifically reserving the buffer region.

31. The method of manufacturing semiconductor integrated circuit devices according to claim 28,
wherein the semiconductor wafer to be regenerated waits a subsequent semiconductor wafer and removes the photosensitive organic film, broken into a subsequent semiconductor wafer and performs continuously subsequent coating the photosensitive organic film after completion of processing on a semiconductor wafer which has been coated with the photosensitive organic film at the time regeneration is determined; and
wherein the waiting semiconductor wafers is controlled to resume the processing thereon after completion of processing on the wafer to be regenerated, to eliminate neither buffer region nor storage in a buffer region.

32. The method of manufacturing semiconductor integrated circuit devices according to claim 24, further comprising a step of processing the semiconductor wafer to be regenerated in processing after regeneration using the amount of correction used when the semiconductor wafer was processed and the amount of correction calculated from the result instead of the amount of correction used when other semiconductor wafers are processed.

33. The method of manufacturing semiconductor integrated circuit devices according to claim 24, further comprising the steps of:
waiting for the result of a test for a predecessor semiconductor wafer at a previously specified step within a sequential flow of processing; and
correcting a previously specified semiconductor wafer based on the result of the test to resume the processing in a sequential flow of processing in order to correct the semiconductor wafer using the result of a test on a predecessor semiconductor wafer.

34. The method of manufacturing semiconductor integrated circuit devices according to claim 24,
wherein said step of specifying a waiting semiconductor wafer and waiting the semiconductor wafer is controlled to be able to specify a plurality of waiting semiconductor wafers.

35. The method of manufacturing semiconductor integrated circuit devices according to claim 24, further comprising the steps of: when sensing a failure while semiconductor wafers are sequentially tested, temporarily stopping associated processing;
waiting for the result of a test on a previously processed semiconductor wafer; and
making a correction based on the result of the test to resume the processing.

36. The method of manufacturing semiconductor integrated circuit devices according to claim 24,
wherein said tester has a cassette loader, and processes both of a semiconductor wafer supplied from a coater/developer connected in an in-line configuration, and a semiconductor wafer supplied from said cassette loader.

37. The method of manufacturing semiconductor integrated circuit devices according to claim 36,
wherein said cassette loader of said tester is installed in the same direction or on the same plane as the cassette loader of said coater/developer, and has an interface with conveying means common to the cassette loader of said coater/developer.

38. The method of manufacturing semiconductor integrated circuit devices according to claim 36,
wherein said tester has a cassette loader, and has a buffer region between said tester and said coater/developer connected in an in-line configuration, such that said tester can process a semiconductor wafer supplied from the cassette loader, broken into semiconductor wafers sequentially supplied in an in-line manner.

39. The method of manufacturing semiconductor integrated circuit device according to claim 24, further comprising a step of connecting a plurality of testers through a conveyer for conveying supplied semiconductor wafers within said apparatus to sequentially process these tests in a pipeline operation.

40. The method of manufacturing semiconductor integrated circuit device according to claim 39, further comprising the steps of: when a nonstandard failure is detected when the plurality of tests are sequentially processed in a pipeline.

* * * * *